US008950470B2

(12) United States Patent
Erickson et al.

(10) Patent No.: US 8,950,470 B2
(45) Date of Patent: Feb. 10, 2015

(54) THERMAL DIFFUSION CHAMBER CONTROL DEVICE AND METHOD

(75) Inventors: Mark R. Erickson, Newbury Park, CA (US); Aaron L. Dingus, Moorpark, CA (US); Arthur W. Custer, III, Ventura, CA (US); Henry J. Poole, Ventura, CA (US); Nader Jamshidi, Newbury Park, CA (US)

(73) Assignee: Poole Ventura, Inc., Oxnard, CA (US)

( * ) Notice: Subject to any disclaimer, the term of this patent is extended or adjusted under 35 U.S.C. 154(b) by 1078 days.

(21) Appl. No.: 12/982,370

(22) Filed: Dec. 30, 2010

(65) Prior Publication Data

US 2012/0168144 A1    Jul. 5, 2012

(51) Int. Cl.
*F28F 27/00*    (2006.01)
*B21D 53/02*    (2006.01)
(Continued)

(52) U.S. Cl.
CPC .......... *G05D 23/2229* (2013.01); *C23C 16/463* (2013.01); *G05D 23/2226* (2013.01);
(Continued)

(58) Field of Classification Search
CPC .......... G05D 23/2229; G05D 23/2224; G05D 23/223; G05D 23/2226; H01L 21/67109; F28D 2021/0077; F28D 1/0477; F28F 1/32; F28C 3/005; C23C 16/45578; C23C 16/463; C23C 16/466; C23C 16/52; C23C 16/54
USPC .................. 165/287; 432/4; 427/374.1, 374.5, 427/374.6, 398.1, 398.3, 398.4, 398.5; 118/715, 724, 666, 696, 712; 156/345.24, 345.37
See application file for complete search history.

(56) References Cited

U.S. PATENT DOCUMENTS

| 2,197,876 | A | 4/1940 | Racen |
| 3,403,243 | A | 9/1968 | Martz et al. |

(Continued)

FOREIGN PATENT DOCUMENTS

| JP | 52122958 | 10/1977 |
| JP | 59201438 | 11/1984 |

(Continued)

OTHER PUBLICATIONS

CVD Equipment Corporation, Rapid Thermal Processing and Rapid Thermal Annealing Systems, Website: http://www.products.cvdequipment.com/products/rtp/in_product6/, p. 1.

(Continued)

*Primary Examiner* — Jeffrie R Lund
(74) *Attorney, Agent, or Firm* — Hall Estill Attorneys at Law; Daniel P. Dooley

(57) ABSTRACT

Preferably, obtaining internal and external thermal measurement values of a sealed process chamber allows a control system to generate a control signal based on a comparison of the internal and external thermal measurement values to the predetermined value. The control signal is provided to a fluid handling system, wherein the fluid handling system modulates flow of a first fluid around the exterior of the sealed process chamber. The control signal is further provided to a closed loop heat exchange system, wherein the closed loop heat exchange system modulates flow of a second fluid within an interior cavity of the sealed process chamber based on the control signal. The control signal is still further provided to an open loop heat exchange system, wherein the open loop heat exchange system modulates flow of a third fluid within the interior of cavity of the sealed process chamber.

12 Claims, 15 Drawing Sheets

(51) Int. Cl.

| | | |
|---|---|---|
| *C23C 16/455* | (2006.01) | |
| *C23C 16/52* | (2006.01) | |
| *G05D 23/22* | (2006.01) | |
| *H01L 21/67* | (2006.01) | |
| *F28D 21/00* | (2006.01) | |
| *C23C 16/46* | (2006.01) | |
| *F28C 3/00* | (2006.01) | |
| *F28D 1/047* | (2006.01) | |
| *F28F 1/32* | (2006.01) | |

(52) U.S. Cl.
CPC ........... *C23C16/52* (2013.01); *C23C 16/45578* (2013.01); *G05D 23/2224* (2013.01); *G05D 23/223* (2013.01); *H01L 21/67109* (2013.01); *F28C 3/005* (2013.01); *F28D 1/0477* (2013.01); *F28F 1/32* (2013.01); *F28D 2021/0077* (2013.01)
USPC ......... 165/287; 432/4; 427/398.1; 427/398.3; 427/398.4; 427/398.5; 118/715; 118/724; 118/666; 118/696; 118/712; 156/345.37

(56) References Cited

U.S. PATENT DOCUMENTS

| | | | | |
|---|---|---|---|---|
| 3,933,598 | A | 1/1976 | Pries | |
| 4,172,925 | A | 10/1979 | Chen et al. | |
| 4,266,338 | A | 5/1981 | Chen et al. | |
| 4,751,370 | A | 6/1988 | Crossley et al. | |
| 5,252,141 | A | 10/1993 | Inoue et al. | |
| 5,323,484 | A * | 6/1994 | Nakao et al. | 392/416 |
| 5,452,396 | A | 9/1995 | Sopori | |
| 5,593,608 | A | 1/1997 | Suzuki | |
| 5,616,264 | A | 4/1997 | Nishi et al. | |
| 5,800,631 | A | 9/1998 | Yamada et al. | |
| 5,805,330 | A | 9/1998 | Byker et al. | |
| 6,002,109 | A | 12/1999 | Johnsgard et al. | |
| 6,045,643 | A | 4/2000 | Byker et al. | |
| 6,059,567 | A * | 5/2000 | Bolton et al. | 432/81 |
| 6,095,083 | A | 8/2000 | Rice et al. | |
| 6,204,443 | B1 | 3/2001 | Kiso et al. | |
| 6,223,975 | B1* | 5/2001 | Blohmann et al. | 228/232 |
| 6,320,115 | B1 | 11/2001 | Kataoka et al. | |
| 6,352,430 | B1* | 3/2002 | Garn et al. | 432/77 |
| 6,369,361 | B2* | 4/2002 | Saito et al. | 219/390 |
| 6,371,354 | B2* | 4/2002 | Blohmann et al. | 228/9 |
| 6,433,913 | B1 | 8/2002 | Bauer et al. | |
| 6,639,196 | B1* | 10/2003 | Fiala et al. | 219/632 |
| 6,744,023 | B2* | 6/2004 | Garn et al. | 219/632 |
| 6,961,168 | B2 | 11/2005 | Agrawal et al. | |
| 6,986,739 | B2 | 1/2006 | Warren et al. | |
| 7,091,453 | B2 | 8/2006 | Murayama et al. | |
| 7,119,937 | B2 | 10/2006 | Warner et al. | |
| 7,133,606 | B1 | 11/2006 | Elliott et al. | |
| 7,196,262 | B2 | 3/2007 | Gronet | |
| 7,235,736 | B1 | 6/2007 | Buller et al. | |
| 7,253,017 | B1 | 8/2007 | Roscheisen et al. | |
| 7,259,322 | B2 | 8/2007 | Gronet | |
| 7,394,016 | B2 | 7/2008 | Gronet | |
| 7,450,292 | B1 | 11/2008 | Burrell et al. | |
| 7,576,017 | B2 | 8/2009 | Tuttle | |
| 7,633,669 | B2 | 12/2009 | Burrell et al. | |
| 7,857,756 | B2 | 12/2010 | Warren et al. | |
| 8,097,085 | B2* | 1/2012 | Erickson et al. | 118/724 |
| 8,430,963 | B2* | 4/2013 | Paulman et al. | 118/719 |
| 2001/0027969 | A1 | 10/2001 | Takahashi et al. | |
| 2001/0027970 | A1 | 10/2001 | Li et al. | |
| 2001/0042594 | A1 | 11/2001 | Shamouilian et al. | |
| 2002/0046704 | A1 | 4/2002 | Anderson | |
| 2002/0195437 | A1 | 12/2002 | Kusuda | |
| 2003/0081945 | A1 | 5/2003 | Kusuda | |
| 2003/0089132 | A1 | 5/2003 | Kusuda | |
| 2003/0091951 | A1 | 5/2003 | Guilmette et al. | |
| 2004/0013418 | A1 | 1/2004 | Kusuda et al. | |
| 2004/0013419 | A1 | 1/2004 | Sakuma et al. | |
| 2004/0018008 | A1 | 1/2004 | Koren et al. | |
| 2004/0018751 | A1 | 1/2004 | Kusuda | |
| 2004/0037543 | A1 | 2/2004 | Kusuda et al. | |
| 2004/0134612 | A1 | 7/2004 | Numata | |
| 2004/0238649 | A1 | 12/2004 | Ohminami | |
| 2006/0251827 | A1 | 11/2006 | Nowak et al. | |
| 2007/0012341 | A1 | 1/2007 | Douglas et al. | |
| 2007/0240760 | A1 | 10/2007 | Gronet | |
| 2007/0295389 | A1 | 12/2007 | Capps et al. | |
| 2008/0017114 | A1 | 1/2008 | Watanabe et al. | |
| 2009/0023229 | A1 | 1/2009 | Matsushita et al. | |
| 2009/0025640 | A1 | 1/2009 | Sager et al. | |
| 2009/0175605 | A1 | 7/2009 | Kobayashi | |
| 2009/0289053 | A1 | 11/2009 | Ranish et al. | |
| 2010/0012187 | A1 | 1/2010 | Paull et al. | |
| 2010/0050935 | A1 | 3/2010 | Roussillon et al. | |
| 2010/0267188 | A1 | 10/2010 | Parks et al. | |
| 2010/0300352 | A1 | 12/2010 | Roussillon et al. | |
| 2011/0143297 | A1* | 6/2011 | Erickson et al. | 432/200 |
| 2011/0249960 | A1* | 10/2011 | Poole et al. | 392/408 |
| 2011/0254228 | A1* | 10/2011 | Custer et al. | 277/312 |
| 2012/0168143 | A1* | 7/2012 | Erickson et al. | 165/287 |
| 2012/0168144 | A1* | 7/2012 | Erickson et al. | 165/287 |
| 2013/0153201 | A1* | 6/2013 | Erickson et al. | 165/287 |
| 2013/0153202 | A1* | 6/2013 | Erickson et al. | 165/287 |
| 2013/0192522 | A1* | 8/2013 | Erickson et al. | 118/666 |

FOREIGN PATENT DOCUMENTS

| | | |
|---|---|---|
| JP | 9326366 | 12/1997 |
| WO | 9221144 | 11/1992 |
| WO | 9510639 | 4/1995 |

OTHER PUBLICATIONS

Key High Vacuum Products, Inc., Chamber Accessories and Feedthroughs, Website: http://www.keyhigh.com/section11.pdf, pp. 1-38.

* cited by examiner

US 8,950,470 B2

THERMAL DIFFUSION CHAMBER CONTROL DEVICE AND METHOD

FIELD OF THE INVENTION

The claimed invention relates to the field of thermal diffusion chamber equipment and methods of making and controlling thermal diffusion chambers for the production of solar energy panels, and more particularly to devices and methods of controlling a cooling of an external surface and interior volume of a process chamber of the thermal diffusion chamber.

BACKGROUND

A form of solar energy production relies on solar panels, which in turn rely on the diffusion of select materials onto a substrate. In one example, glass is used as the substrate, which is exposed to a gaseous selenide species to form a copper, indium and selenide containing film on the substrate. The gaseous selenide species is known to be toxic to humans, which underscores prudent handling methods, including thermal regulation systems.

As such, thermal regulation systems capable of precluding migration and leakage of the gaseous selenide species from within a process chamber to atmosphere, in an efficient and reliable manner, can greatly improve the operation and production output of thermal chambers used in providing substrates a copper, indium and selenide containing film diffused within them.

Accordingly, there is a continuing need for improved mechanisms and methods of thermal regulation of the process chamber for thermal diffusion chambers.

SUMMARY OF THE INVENTION

The present disclosure relates to thermal diffusion chambers and in particular to thermal control systems and methods for controlling the internal and external temperature of a process chamber of thermal diffusion chamber equipment.

In accordance with various exemplary embodiments, an exterior temperature of a sealed process chamber is monitored, and based on the monitored external temperature of the sealed process chamber; an exterior thermal measurement value is transmitted to a control system. The control system compares the external thermal measurement value to a predetermined value, and generates a control signal based on the comparison of the external thermal measurement value to the predetermined value The control signal is provided by the control system to a first fluid handling system, wherein the first fluid handling system modulates flow of a first fluid around the exterior of the sealed process chamber based on the control signal. The control system further provides the control signal to a second fluid handling system, wherein the second fluid handling system modulates flow of a second fluid within an interior cavity of the sealed process chamber based on the control signal.

In an alternate exemplary embodiment, an internal and external temperature of a sealed process chamber is monitored, and based on the monitored internal and external temperature of a sealed process chamber; each an internal and external thermal measurement value is transmitted to a control system. The control system compares the internal and external thermal measurement values to a predetermined value, and generates a control signal based on the comparison of the internal and external thermal measurement values to the predetermined value.

The control signal is provided by the control system to a first fluid handling system, wherein the first fluid handling system modulates flow of a first fluid around the exterior of the sealed process chamber based on the control signal. The control system further provides the control signal to a second fluid handling system, wherein the second fluid handling system modulates flow of a second fluid within an interior cavity of the sealed process chamber based on the control signal.

In accordance with various alternative exemplary embodiments, an exterior temperature of a sealed process chamber is monitored, and based on the monitored external temperature of the sealed process chamber; an exterior thermal measurement value is transmitted to a control system. The control system compares the external thermal measurement value to a predetermined value, and generates a control signal based on the comparison of the external thermal measurement value to the predetermined value.

The control signal is provided by the control system to a fluid handling system, wherein the fluid handling system modulates flow of a first fluid around the exterior of the sealed process chamber based on the control signal. The control signal is further provided to a closed loop heat exchange system, wherein the closed loop heat exchange system modulates flow of a second fluid within an interior cavity of the sealed process chamber based on the control signal. Still further, the control signal is provided by the control system to an open loop heat exchange system, wherein the open loop heat exchange system modulates flow of a third fluid within the interior of cavity of the sealed process chamber.

Alternatively, an internal and external temperature of a sealed process chamber is monitored, and based on the monitored internal and external temperature of a sealed process chamber, each an internal and external thermal measurement value is transmitted to a control system. The control system compares the internal and external thermal measurement values to a predetermined value, and generates a control signal based on the comparison of the internal and external thermal measurement values to the predetermined value.

The control signal is provided by the control system to a fluid handling system, wherein the fluid handling system modulates flow of a first fluid around the exterior of the sealed process chamber based on the control signal. The control signal is further provided to the closed loop heat exchange system, wherein the closed loop heat exchange system modulates flow of a second fluid within an interior cavity of the sealed process chamber based on the control signal. Still further, the control signal is provided by the control system to an open loop heat exchange system, wherein the open loop heat exchange system modulates flow of a third fluid within the interior of cavity of the sealed process chamber.

These and various other features and advantages that characterize the claimed invention will be apparent upon reading the following detailed description and upon review of the associated drawings.

DETAILED DESCRIPTION OF AN EXEMPLARY EMBODIMENT OF THE DRAWINGS

Reference will now be made in detail to one or more examples of various embodiments of the present invention depicted in the figures. Each example is provided by way of explanation of the various embodiments of the present invention, and not meant as a limitation of the invention. For example, features illustrated or described as part of one embodiment may be used with another embodiment to yield still a different embodiment. Other modifications and variations to the described embodiments are also contemplated within the scope and spirit of the claimed invention.

Figure 1:
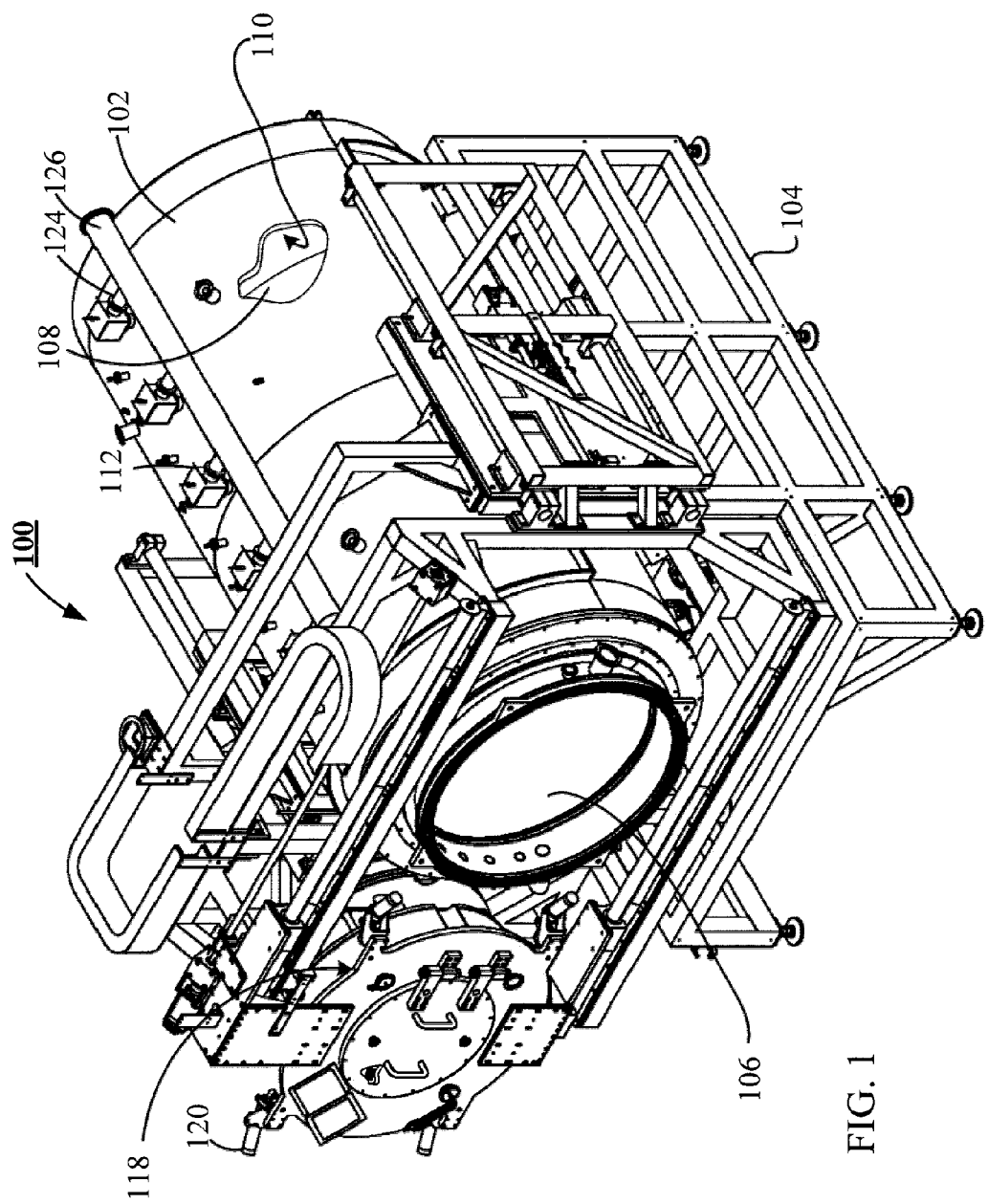
FIG. 1 displays an orthogonal projection, with partial cutaway, of an exemplary embodiment of a thermal chamber of the claimed invention.

Turning to the drawings, FIG. 1 displays an exemplary thermal diffusion chamber 100 which includes at least a containment chamber 102 supported by a frame 104. The containment chamber 102 in turn supports a process chamber 106. Preferably the exemplary thermal diffusion chamber 100 further includes a heat source chamber 108 disposed between the process chamber 106 and the containment chamber 102, and a thermal regulation cavity 110 formed between the process chamber 106 and the heat source chamber 108. FIG. 1 further shows that least one fluid inlet box 112 is provided, which is in fluidic communication with the thermal regulation cavity 110.

Figure 2:
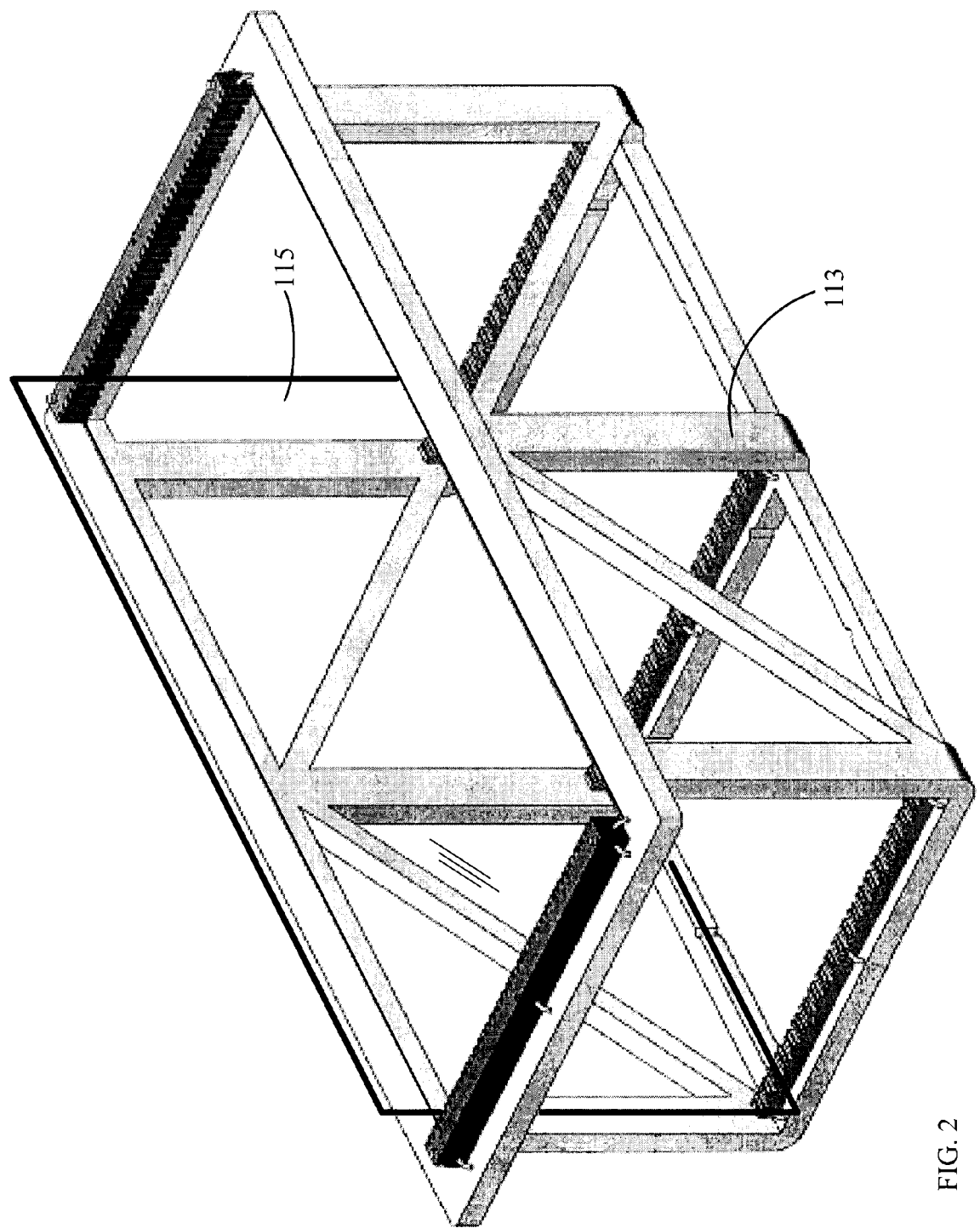
FIG. 2 provides an orthogonal projection of an exemplary substrate support frame configured for use with the exemplary embodiment of the thermal chamber of FIG. 1.

FIG. 2 shows an exemplary substrate support frame 113 configured for use with the exemplary embodiment of the thermal diffusion chamber 100 (of FIG. 1). In a preferred embodiment, the substrate support frame 113 is formed from quarts and accommodates a plurality of substrates 115 (one shown). In operation, the substrate support frame 113 is filled to capacity with substrates 115 and positioned within the process chamber 106. Within the process chamber 106, the substrate support frame 113, serves as a fixture for the substrates 115 during the diffusion process. Preferably the substrates 115 are rectangular in shape having a width of substantially 650 millimeters and a length of substantially 1650 millimeters, and are formed from glass, preferably soda-limesilica glass.

Figure 3:
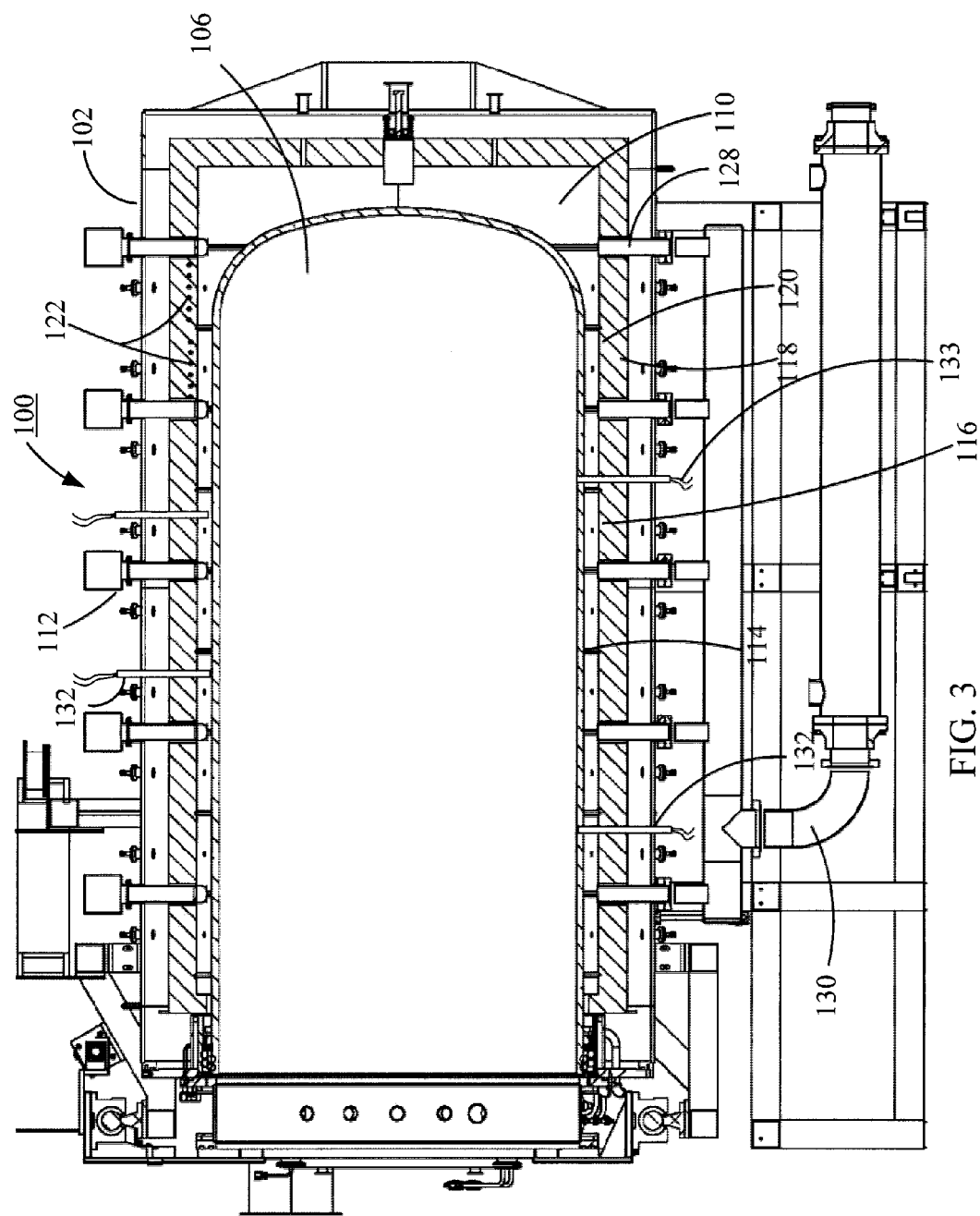
FIG. 3 shows a cross-sectional, right side elevation view of the exemplary embodiment of the thermal chamber of FIG. 1.

FIG. 3 shows an exemplary embodiment of the thermal diffusion chamber 100 includes the fluid inlet box 112 in fluid communication with the thermal regulation cavity 110. Further shown by FIG. 3 is a plurality of supports 114 preferably positioned between the heat source chamber 108 and the process chamber 106.

In a preferred exemplary embodiment, the heat source chamber is formed from a plurality of heaters 116 (also referred to herein as a heat source), which in an exemplary embodiment consists of substantially a total of twenty two (22) heaters. Preferably, each heater provides a heater shell 118, heater insulation 120 adjacent the heater shell, and a plurality of heating elements 122. In an exemplary embodiment, the heating elements 122 are powered by electricity, and are preferably a coiled element. However it is noted that the term "heat source" is not limited to the disclosed plurality of heaters 116. The heat source 116 may include, but is not limited to, natural gas, super heated steam, geo-thermal energy, or any other source of energy to produce a desired temperature within the process chamber 106.

Returning back to FIG. 1, which shows the fluid inlet box 112 further includes an inlet conduit 124 secured to an inlet manifold 126. Preferably the inlet manifold 126 delivers air to the fluid inlet boxes 112 for distribution over the process chamber 106, as depicted in FIG. 3.

FIG. 3 further shows the exemplary thermal diffusion chamber 100 includes a purge conduit 128 in fluidic communication with the thermal regulation cavity 110 and secured to an outlet manifold 130, the outlet manifold 130 selectively providing an internal pressure less than atmospheric pressure to draw air through the fluid inlet box 112, around the process chamber 106, and out the purge conduit 128.

Also shown by FIG. 3, is a plurality of external thermal sensors 132 in contacting adjacency with the process chamber 106, extending through corresponding heaters 116, and presenting electrical lead lines 133 for connection from the outside of the containment chamber 102. In a preferred mode of operation of the exemplary thermal diffusion chamber 100, fluid flow is suspended, i.e., the fluid flow undergoes fluid flow modulation, to provide a more accurate reading of the external temperature of the process chamber 106. Information collected from the plurality of thermal sensors 132 is used to cross check information collected by an internal thermal sensor assembly 158 of FIG. 8. Preferably the information collected by the internal thermal sensors is used to determine which fluid inlet boxes 112 should undergo a restriction of fluid flow, and which should be adjusted for maximum fluid flow.

By adjusting the fluid flow through the plurality of fluid inlet boxes 112, a more uniform cool down of the process chamber 106 may be attained. Further, in an alternate preferred mode of operation of the exemplary thermal diffusion chamber 100, the internal thermal sensor assembly 158, with additional input from the plurality of thermal sensors 132, provides information for regulating an amount of power supplied to the heating elements 122 during a heat up cycle of the process chamber 106. That is, during a heat up cycle of the process chamber 106, power being supplied to each of the plurality of heater 116. By modulating the power is supplied to each of the plurality of heaters 116 can be modulated, and a more uniform heat up of the process chamber 106 may be attained.

Figure 4:
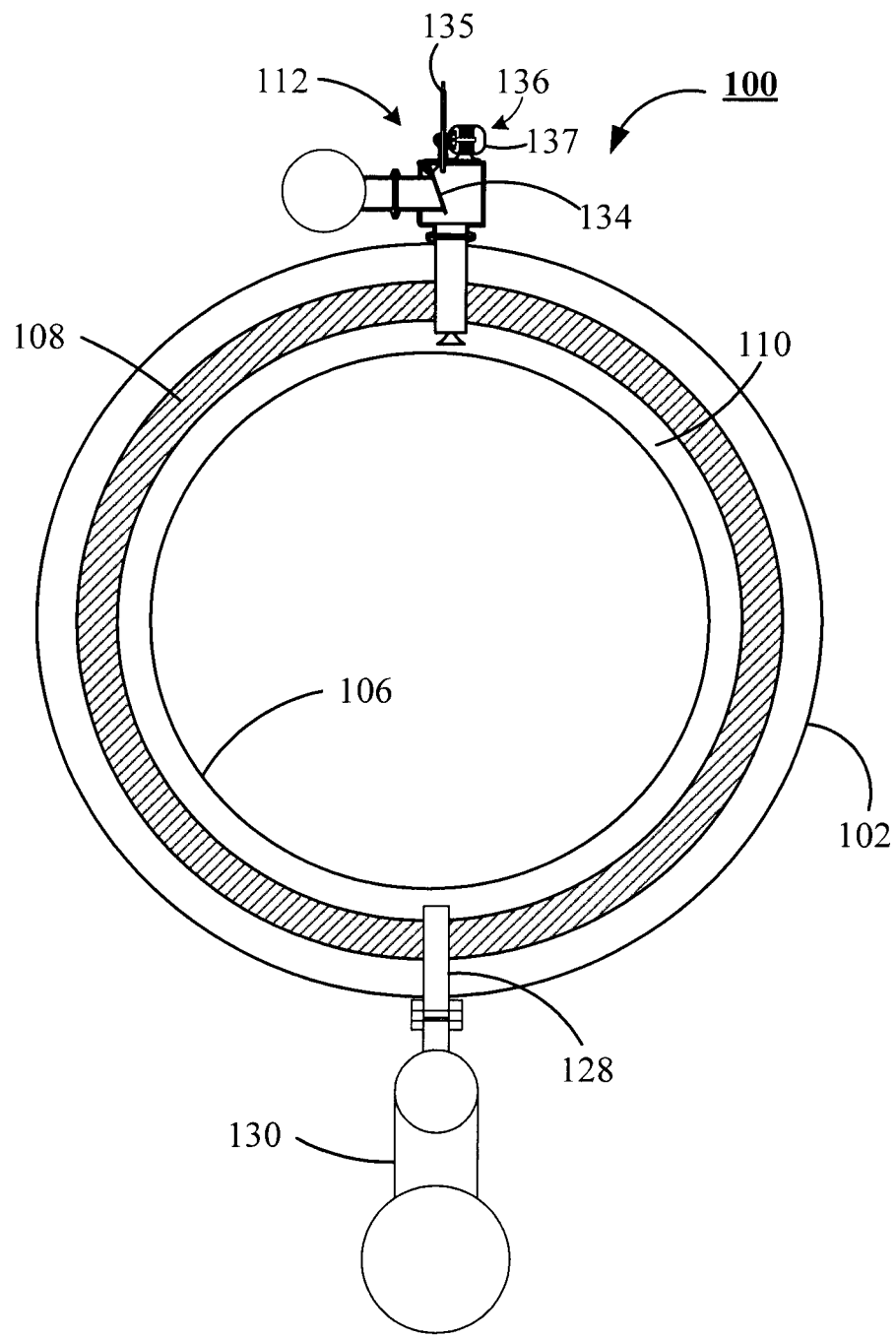
FIG. 4 illustrates a cross-sectional, front elevation view of the exemplary embodiment of the thermal chamber of FIG. 1 showing an exhaust manifold and conduit.

FIG. 4 depicts the fluid inlet box 112 includes a plate valve 134, which mitigates the flow of fluid from the thermal regulation cavity 110 through the fluid inlet box 112 and external to the containment chamber 102. FIG. 4 further shows the fluid inlet box 112 includes a flow adjustment structure 136, which preferably includes a positioning shaft 135 controlled by a motor 137. In response to a rotation of the motor 137, the positioning shaft 135 interacts with the plate valve 134 to control fluid flow from the exterior of the containment chamber 102 past the plate valve 134 and into the thermal regulation cavity 110.

Figure 5:
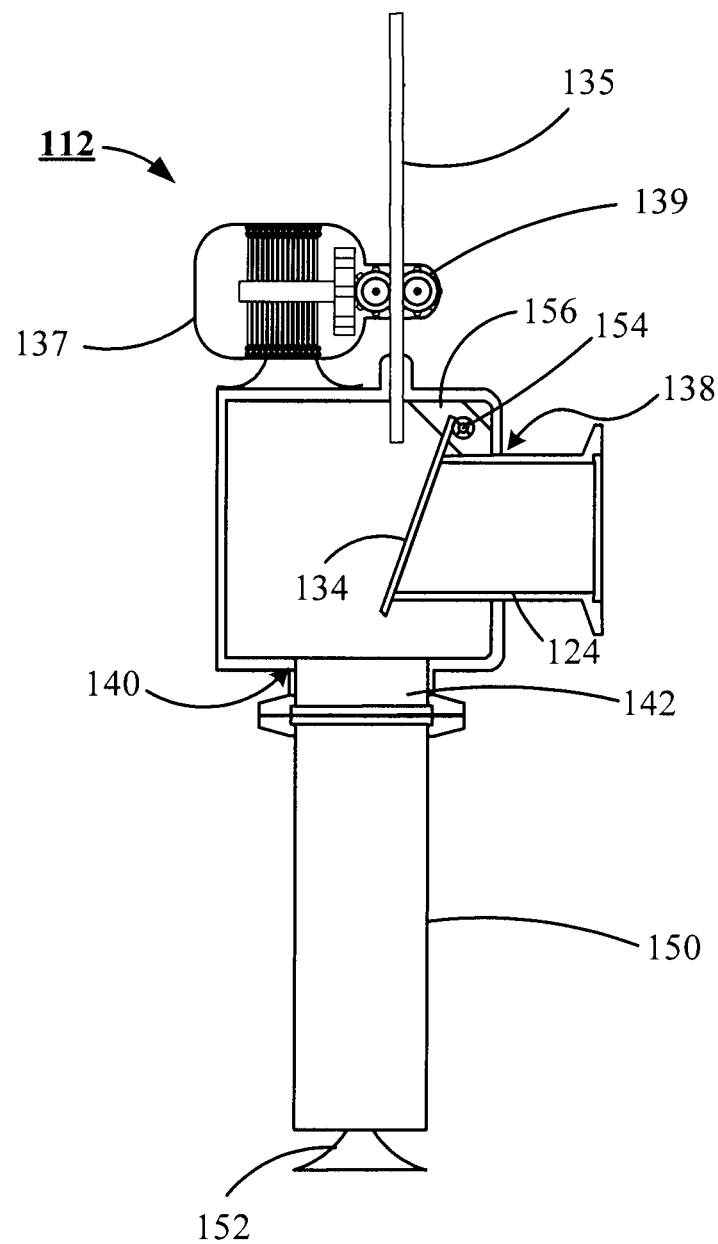
FIG. 5 provides an enlarged detailed cross-sectional, elevation view of a fluid inlet box with an attached inlet conduit of the exemplary embodiment of the thermal chamber of FIG. 1

FIG. 5 provides a more detailed view of the fluid inlet box 112. In a preferred embodiment, the fluid inlet box 112 further provides an intake port 138 supporting the inlet conduit 124, which is in contacting adjacency with the plate valve 134. Preferably, the fluid inlet box 112 further provides an exhaust port 140 that supports an outlet conduit 142 that is in fluidic communication with the thermal regulation cavity 110. During an operation of the fluid inlet box 112, a pair of pinch rollers 139 of the motor 137 act upon the positioning shaft 135 to change a position of the positioning shaft 135 relative to the plate valve 134.

As shown by FIG. 5, in a preferred embodiment in addition to providing the exhaust port 140 supporting the outlet conduit 142, the fluid inlet box 112 provides an extension conduit 150 having a proximal end and a distal end, the proximal end in contacting adjacency with and secured to the outlet conduit 142, the extension conduit 150 is provided to conduct fluid originating from the containment chamber 102 to the thermal regulation cavity 110 of FIG. 4. The distal end of the extension conduit 150 is preferably fashioned with a diffusion member 152 affixed thereon, wherein the diffusion member 152 is configured to preclude fluid originating external the containment chamber 102 from being applied to the process chamber 106 of FIG. 4 in a stream normal to the exterior of the process chamber 106.

FIG. 5 further shows the fluid inlet box 112 further provides a pivot pin 154 disposed between the plate valve 134 and a pivot support 156. The pivot support 156 is secured adjacent the inlet conduit 124. The pivot pin 154, in combination with the flow adjustment structure 136, promotes a controlled, predetermined, and adjustable displacement of the plate valve 134 from contacting adjacency with the inlet conduit 124 when fluid is drawn into the thermal regulation cavity 110. The pivot pin further promotes the closing of the plate valve 134 adjacent the inlet conduit 124 when the flow of fluid originating external the containment chamber 102 is stopped. In other words, a closed plate valve 134 deters passage of fluid from the thermal regulation chamber 110 to external the containment chamber 102 when fluid is not being drawn into the thermal regulation cavity 110.

Figure 6:
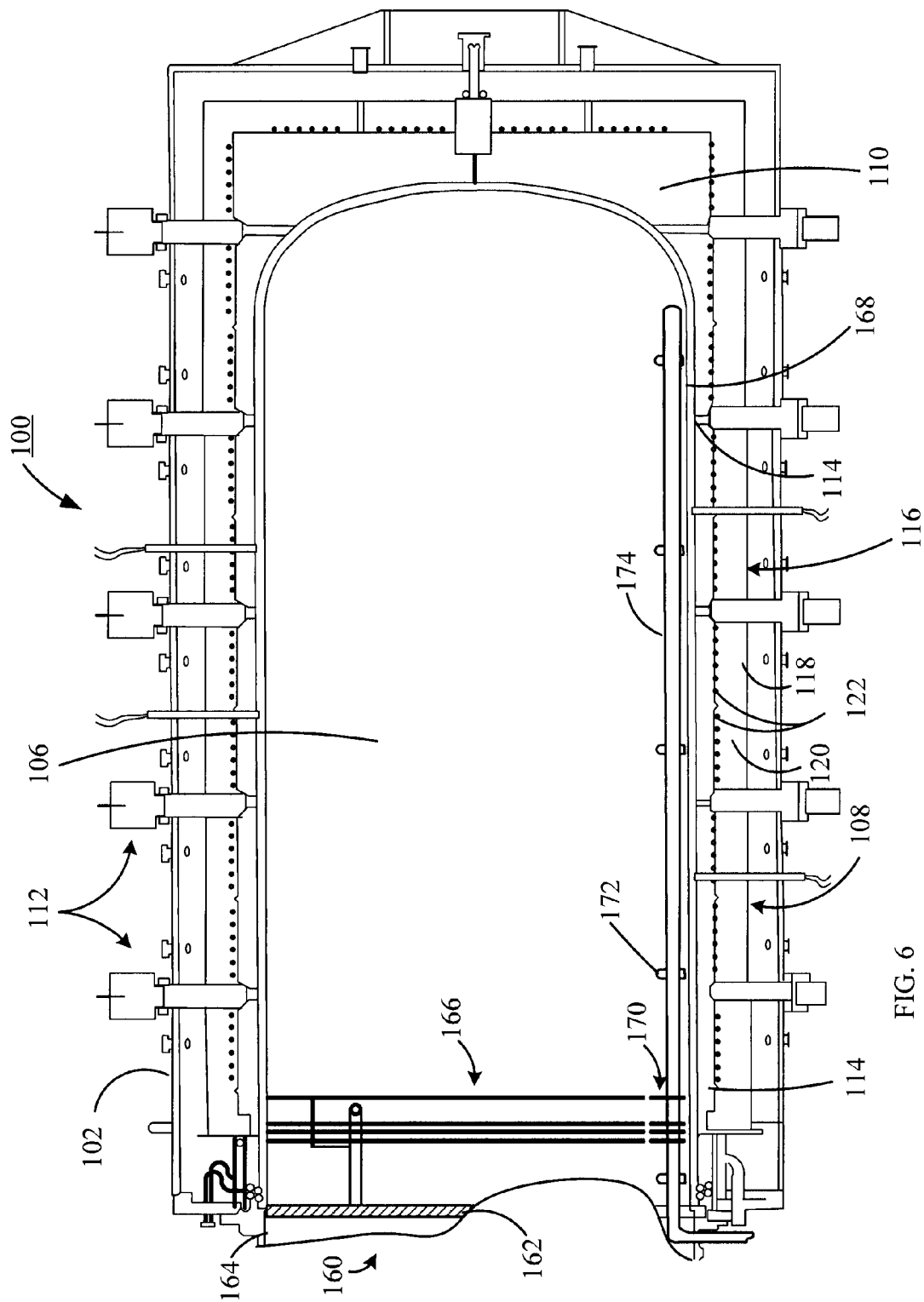
FIG. 6 depicts a cross-sectional, right side elevation view of the exemplary embodiment of the thermal chamber of FIG. 1, showing an exemplary closed loop internal heat exchanger.

FIG. 6 shows that an exemplary embodiment of the thermal diffusion chamber 100 includes the fluid inlet box 112 in fluid communication with the thermal regulation cavity 110. Further shown by FIG. 6 is a chamber door 160. Preferably, the chamber door 160 includes a face plate 162 secured to a main body portion 164, and a primary thermal dispersion assembly 166 secured to the face plate 162. With the exception of a bottom portion, the primary thermal dispersion assembly 166 is aligned in close proximity to an inner surface of a sealed process chamber 168. The sealed process chamber 168 is preferably formed when the chamber door 160 is secured in sealing contact with the process chamber 106.

In the exemplary embodiment of FIG. 6, a secondary thermal dispersion assembly 170 is aligned with the primary thermal dispersion assembly 166 and rests on a bottom of the inner surface of the sealed process chamber 168. In conjunction with a plurality of support members 172, the secondary thermal dispersion assembly 170 confines and supports a closed loop heat exchanger 174 adjacent the bottom of the sealed process chamber 168. The closed loop heat exchanger 174 provides a means for circulation of a fluid through the interior of the sealed process chamber 168, to facilitate a cool down of the interior of the sealed process chamber 168 during a process cycle of the thermal diffusion chamber 100.

Figure 7:
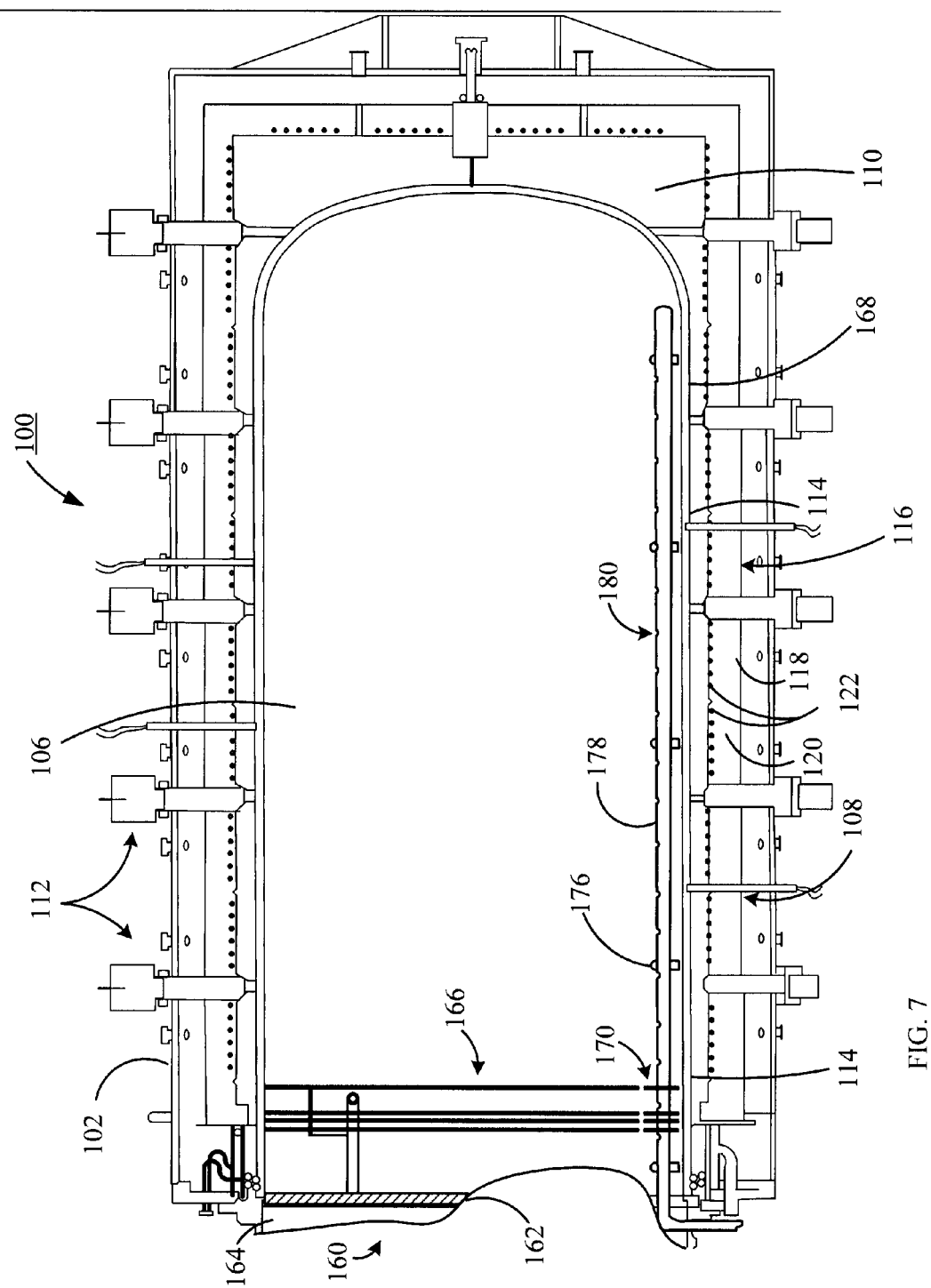
FIG. 7 shows a cross-sectional, right side elevation view of the exemplary embodiment of the thermal chamber of FIG. 1, showing an exemplary open loop internal heat exchanger.

FIG. 7 shows that an alternate exemplary embodiment of the thermal diffusion chamber 100 includes the fluid inlet box 112 in fluid communication with the thermal regulation cavity 110. Further shown by FIG. 7 is the chamber door 160, which preferably includes the face plate 162 secured to the main body portion 164, and the primary thermal dispersion assembly 166 secured to the face plate 162. With the exception of the bottom portion, the primary thermal dispersion assembly 166 is aligned in close proximity to the inner surface of the sealed process chamber 168.

In the alternate exemplary embodiment of FIG. 7, the secondary thermal dispersion assembly 170 is aligned with the primary thermal dispersion assembly 166 and rests on the bottom of the inner surface of the sealed process chamber 168. In conjunction with a plurality of support members 176, the secondary thermal dispersion assembly 170 confines and supports an open loop heat exchanger 178 adjacent the bottom of the sealed process chamber 168. The open loop heat exchanger 178 provides a plurality of supply ports 180 through which fluid may be introduced into the sealed process chamber 168 during a process cycle of the thermal diffusion chamber 100 to facilitate a cool down of the sealed thermal chamber 168.

Figure 8:
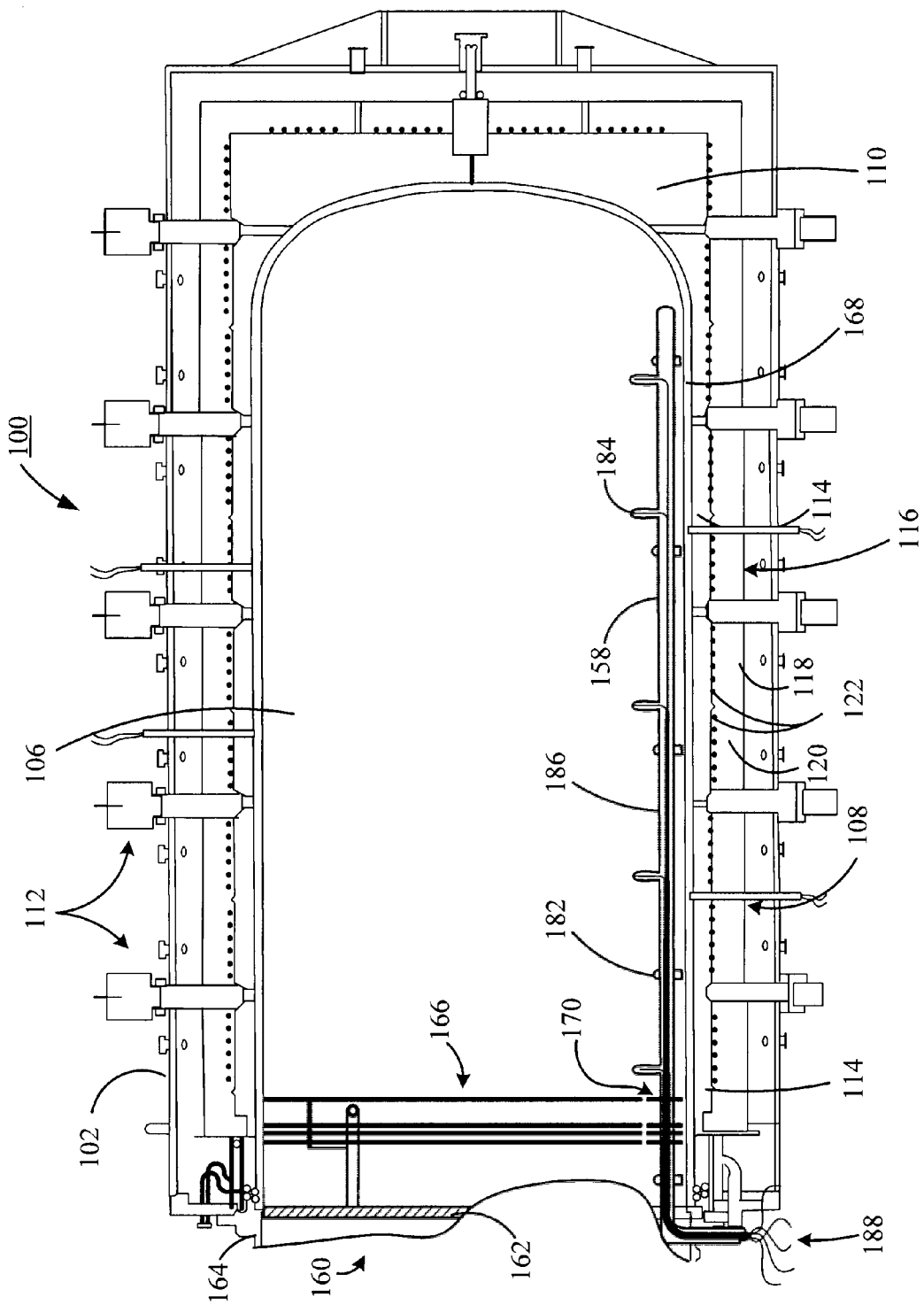
FIG. 8 depicts a cross-sectional, right side elevation view of the exemplary embodiment of the thermal chamber of FIG. 1, showing an exemplary internal thermal sensor.

FIG. 8 shows that an alternative exemplary embodiment of the thermal diffusion chamber 100 includes the fluid inlet box 112 in fluid communication with the thermal regulation cavity 110. Further shown by FIG. 8 is the chamber door 160, which preferably includes the face plate 162 secured to the main body portion 164, and the primary thermal dispersion assembly 166 secured to the face plate 162. With the exception of the bottom portion, the primary thermal dispersion assembly 166 is aligned in close proximity to the inner surface of the sealed process chamber 168.

In the alternative exemplary embodiment of FIG. 8, the secondary thermal dispersion assembly 170 is aligned with the primary thermal dispersion assembly 166 and rests on the bottom of the inner surface of the sealed process chamber 168. In conjunction with a plurality of support members 182, the secondary thermal dispersion assembly 170 confines and supports the thermal sensor assembly 158 adjacent the bottom of the sealed process chamber 168. The thermal sensor assembly 158 provides a plurality of thermocouples 184 disposed along a length of the sealed process chamber 168. The plurality of thermocouples 184, are responsive to a change in temperature of the 158 further includes a sensor conduit 186 extending from an opening of the sealed process chamber through at least a mid portion of the sealed process chamber 168. The sensor conduit 186 shields the plurality of thermocouples from exposure to an internal environment of the sealed process chamber 168.

FIG. 8 further shows that the thermal sensor assembly 158 preferably further includes a plurality of signal lines 188 connected to and corresponding with each of the plurality of thermocouples 184. Each signal line 188 conveys a signal to the exterior of the sealed process chamber 168 in response to the change in temperature of the interior of the sealed process chamber 168.

Figure 9:
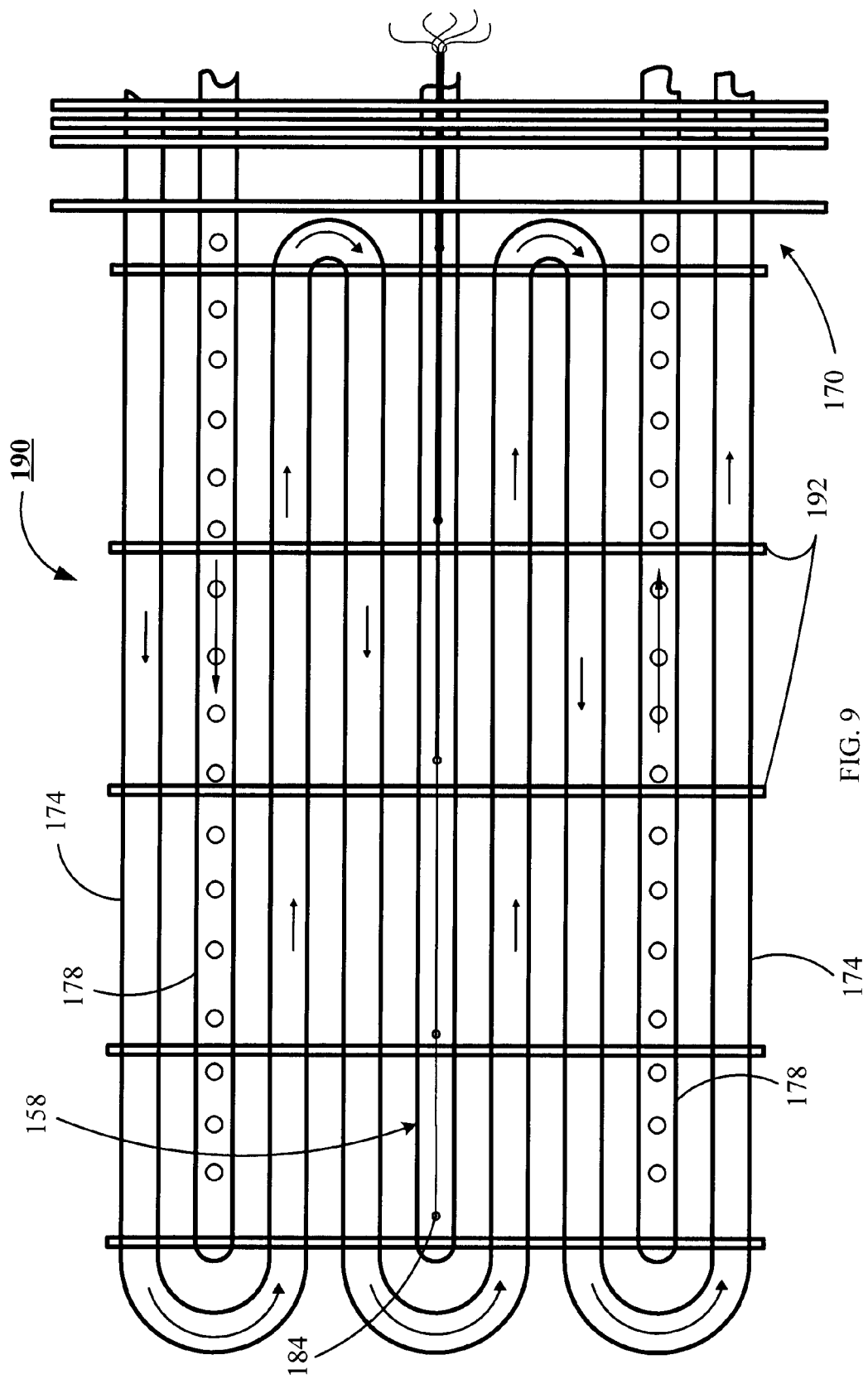
FIG. 9 generally illustrates a plan view of an exemplary combination internal thermal sensor, open loop internal heat exchanger, and closed loop internal heat exchanger assembly of the thermal chamber of FIG. 1.

As shown in a preferred embodiment by FIG. 9, a combined heat exchange assembly 190 includes each: the closed loop heat exchanger 174 of FIG. 6; the open loop heat exchanger 178 of FIG. 7; and the thermal sensor assembly 158 of FIG. 8. The closed loop heat exchanger 174, the open loop heat exchanger 178, and the thermal sensor assembly 158 are each supported by a plurality of heat exchanger supports 192, and attached to and confined by the secondary thermal dispersion assembly 170.

Figure 10:
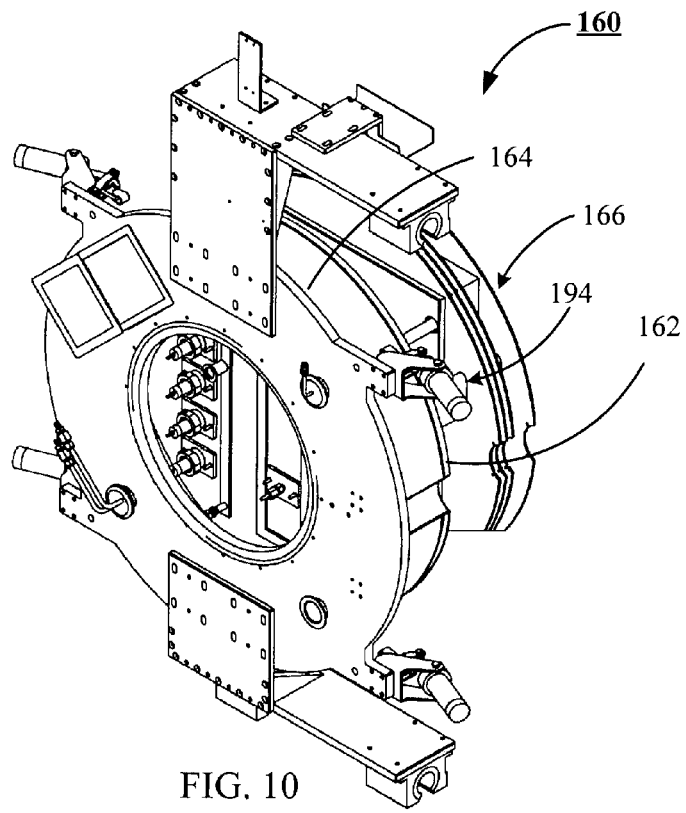
FIG. 10 displays an orthogonal projection, of an exemplary door with attached primary thermal deflection assembly, of the thermal chamber of FIG. 1.

FIG. 10 provides a more detailed depiction of the chamber door 160. Preferably, the chamber door 160 includes a face plate 162 secured to the main body portion 164, and a lamp support 194 secured to the face plate 162. As shown by FIG. 10, the chamber door 160 further includes the primary thermal dispersion assembly 166, while the lamp support 194 provides a plurality of alignment notches 195 (shown by FIG. 11) upon which the thermal dispersion assembly 166 is aligned and rests during operational modes of the thermal diffusion chamber 100 of FIG. 8.

Figure 11:
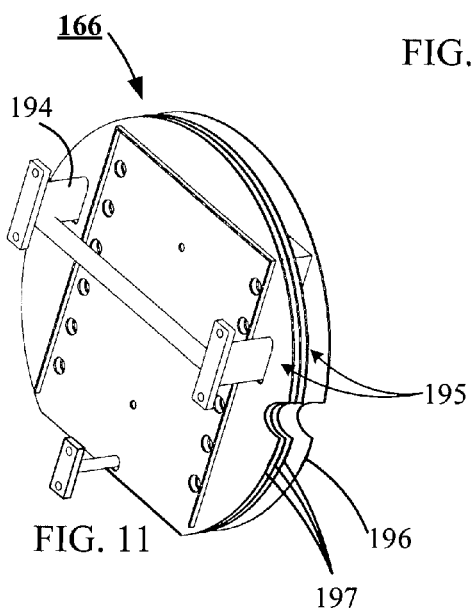
FIG. 11 provides an orthogonal projection of the primary thermal dispersion assembly of FIG. 10.

FIG. 11 further shows the primary thermal dispersion assembly 166 includes at least a diffusion plate 196 adjacent a plurality of radiation reflection plates 197. The diffusion plate 195 and a plurality of radiation reflection plates 197 are preferably held in alignment by the lamp support 194. In a preferred exemplary embodiment, the main body portion 164, the face plate 162, and the thermal dispersion assembly 166 are preferably formed from quartz.

Figure 12:
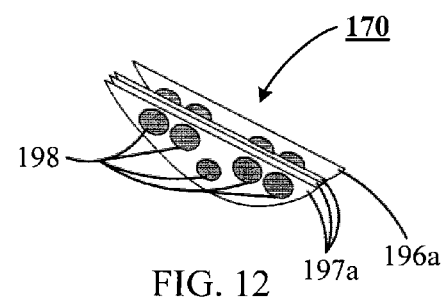
FIG. 12 shows an orthogonal projection of a secondary thermal dispersion assembly of the thermal chamber of FIG. 1.

FIG. 12 shows the secondary thermal dispersion assembly 170 provides a plurality of access ports 198, which are used to align, support, and confine each closed loop heat exchanger 174, the open loop heat exchanger 178, and the thermal sensor assembly 158 of FIG. 8. Preferably, the secondary thermal dispersion assembly 170 includes at least a diffusion plate 196a adjacent a plurality of radiation reflection plates 197a, which in a preferred embodiment are formed from quartz.

Figure 13:
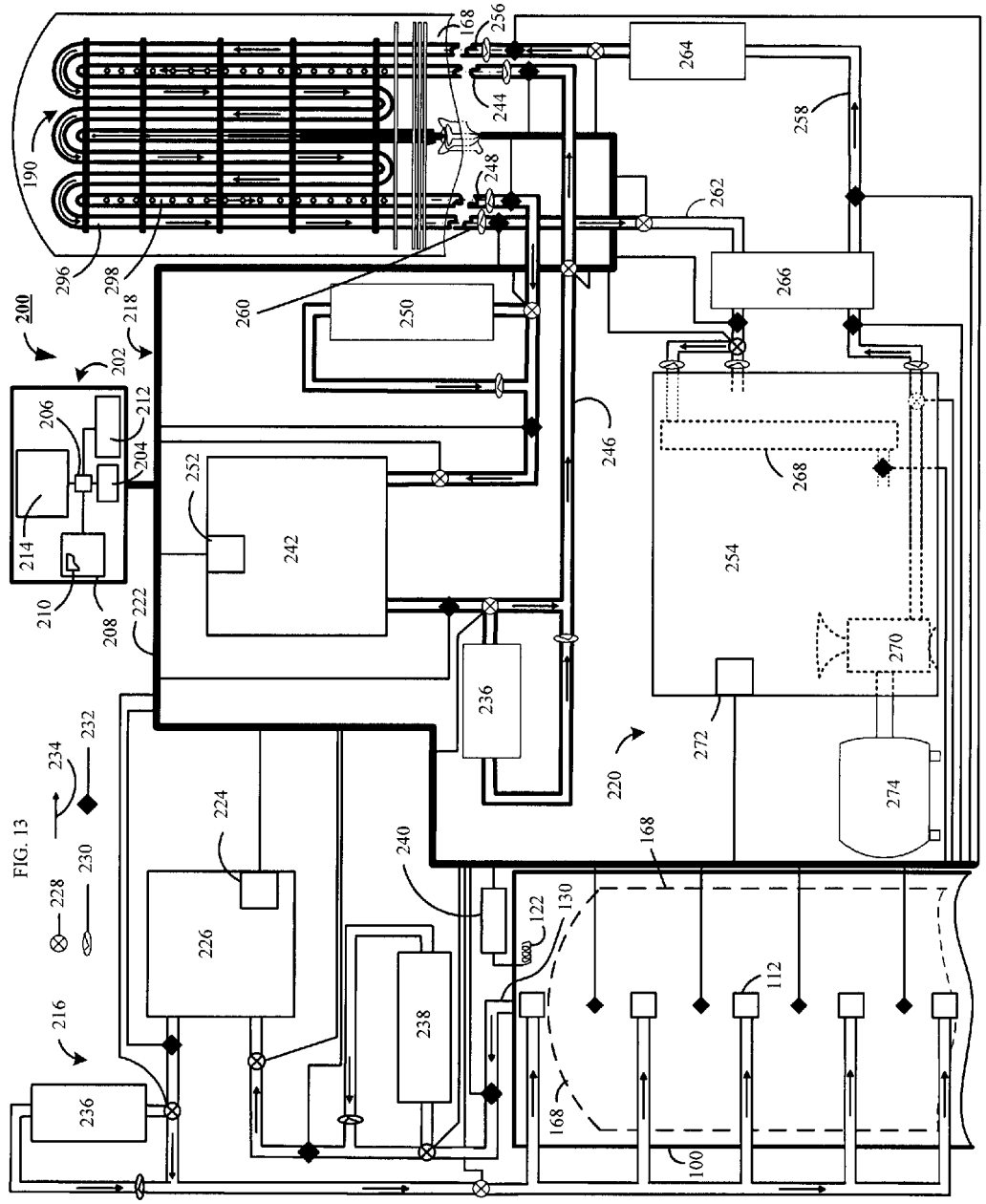
FIG. 13 illustrates a schematic of a cool down heat exchange system for use in cooling down the interior and exterior of the thermal chamber of FIG. 1.

FIG. 13 illustrates a schematic of a heat exchange system 200 for use in cooling down an interior and an exterior of the sealed thermal chamber 168 during a process cycle of the thermal diffusion chamber 100. In a preferred embodiment, the heat exchange system 200 includes a control system 202 (also referred to herein as controller 202) communicating with each a first fluid handling system 216, a second fluid handling system 218, and third fluid handling system 220. Preferably, the control system 202 includes at least a control signal buss 222 communicating with at least the first, second, and third fluid handling systems (216, 218, 220), and a controller 204.

In a preferred embodiment, the controller 202 includes at least an input/output module 204 communicating with the control signal buss 222, a processor 206 communicating with the input/output module 204, a memory 208 storing control logic 210 and communicating with the processor 204, an input device 212 communicating with the processor 204, and a display 214 communicating with the processor 206.

During a preferred operation of the thermal chamber 100, upon receipt by the input/output module 204 of a measured temperature value of a first fluid flowing around the exterior of the sealed process chamber 168, the input/output module 204 provides said measured temperature value of the first fluid flowing around the exterior of the sealed process chamber to the processor 206. The processor 206 accesses the stored control logic 210 and determines a control signal based on the measured temperature value of the first fluid flowing around the exterior of the sealed process chamber 168. The processor 206 transmits the control signal to the input/output module 204, the input/output module 204 advances the control signal by way of the control signal buss 222 to the first fluid handling system 216.

Preferably, the processor 206 further determines an in use flow capacity percentage of fluid flowing through the first fluid handling system 216 based on data received from a flow usage monitoring device 224 communicating with a fluid transfer device 226 of the first fluid handling system 216. The processor 206 still further preferably provides the in use flow capacity percentage of the first fluid transfer devices 226 and the measured temperature value of the first fluid flowing around the exterior of the sealed process chamber 168 to the display 214.

The schematic of FIG. 13 shows that the heat exchange system 200 preferably utilizes a plurality of control valves 228, responsive to control signals generated by the processor 206 and provided to each of the plurality of control valves 228 by the control signal buss 222 to control the flow of fluids through each the first, second, and third fluid handling systems (216, 218, 220). FIG. 13 further shows that the heat exchange system 200 preferably utilizes a plurality of check valves 230 to control backflow of the flow of fluids through each the first, second, and third fluid handling systems (216, 218, 220), and a plurality of thermal sensors 232 to provide temperature measurement values to the processor 206 upon which the processor basses the determination of a plurality of control signals to be transmitted to each corresponding control valve of the plurality of control valves 228.

FIG. 13 still further provides a flow direction symbol 234, which reveals the direction of flow of fluids through each corresponding the first, second, and third fluid handling systems (216, 218, 220), and that each of the plurality of thermal sensors 232 along with each of the plurality of control valves 228 communicate with the control signal buss 222. In a preferred embodiment, the first fluid handling system 216 includes at least the first fluid transfer device 226 in fluid communication with at least one fluid inlet box 112. The at least one fluid inlet box 112 is preferably in fluidic communication with an exterior of the sealed process chamber 168, and the at least one fluid inlet box 112 includes at least: the flow adjustment structure 137 (of FIG. 5) to control the flow of the first fluid around the exterior of the sealed process chamber 168; and a fluid return conduit 130 in fluid communication with each the exterior of the sealed process chamber 168 and the first fluid transfer device 226, the fluid return conduit 130 returning the first fluid flowing around the sealed process chamber 168 to the first fluid transfer device 226.

As shown by FIG. 13, the first fluid handling system preferably includes a first thermal sensor of the plurality of fluid sensors 232 communicating with each the returned first fluid and the control system 202, the first thermal sensor measures a temperature value of the returned first fluid and provides that value to the control system 202. Upon receipt of the measured temperature value by the control system 202, the processor 206 of the control system 202 compares the measured temperature value to a predetermined temperature value and sends a control signal to a first control valve of the plurality of control valves 228 disposed between the fluid return conduit 130 and the first fluid transfer device 226. In response to the control signal, the first control valve modulates flow of the returned first fluid from the exterior of the sealed process chamber 168 to the first fluid transfer device 226.

Further shown by FIG. 13, the first fluid handling system 216 preferably further includes an in line fluid heater 236, such as a SureHeat MAX® manufactured by OSRAM Sylvania of Danvers Main, USA. Preferably the in line heater 236 is plumbed into the first fluid handling system 216 between the fluid transfer device 226 and the plurality of fluid inlet boxes 112. The in line fluid heater 236 may be selectively included in the fluid path of the first fluid through activation of a second control valve in response to a control signal provided by the control signal buss 222 from the processor 206 based on a temperature measurement value provided by a second thermal sensor measuring the first fluid exiting the fluid transfer device 226. The in line fluid heater 236 is preferably used when the out flow temperature of the first fluid departing the fluid transfer device 226 is less than a desired inlet temperature of the fluid inlet box 112.

Additionally, the first fluid handling system 216 preferably further includes a heat exchanger 238, external to and plumbed into the first fluid handling system 216 between the thermal diffusion chamber 100 and the fluid transfer device 226. The heat exchanger 238 may be selectively included in the fluid path of the first fluid through activation of a third control valve in response to a control signal provided by the control signal buss 222 from the processor 206 based on a temperature measurement value provided by a third thermal sensor measuring the first fluid exiting the thermal diffusion chamber 100. Preferably, the heat exchanger 238 is utilized to safeguard the fluid transfer device 226 from experiencing a thermal condition that exceeds its operating parameters.

To provide data regarding an in use thermal capacity of each of the plurality of heat sources 116 (of FIG. 8), the first fluid handling system 216 preferably further includes an energy usage monitoring device 240 communicating with each the heat elements 122 of the plurality of heat sources 116 and the control system 202. The energy monitoring device 240 is preferably used to safeguard against thermal runaway of each of the plurality of heat sources 116. That is, when any of the plurality of heat sources 116 exceeds a preferred, predetermined usage percentage, the processor 206 issued a command to an energy source control unit instructing the energy source control unit to stop the supply of energy to the out of operating range heat source 116. The processor further preferably provides the in use thermal capacity status of each of the plurality of heat sources 116 to the display 214 for presentation by the display 214.

In the preferred embodiment, shown by FIG. 13, the third fluid handling system 220 preferably includes at least a closed system fluid transfer device 242 in fluid communication with at least one fluid distribution conduit 244. The at least one fluid distribution conduit 244 is preferably in fluidic communication with an interior of the sealed process chamber 168. Preferably, a feed conduit 246 is disposed between the second fluid transfer device 242 and the at least one fluid distribution conduit 242. The feed conduit 246 preferably communicates the second fluid from the second fluid transfer device 242 to the at least one fluid distribution conduit 244.

Also preferably provided by the second fluid handling system 218 is a check valve disposed between the feed conduit 246 and the at least one fluid distribution conduit 244, the check valve mitigating a back flow from the interior of the sealed process chamber 168 to the second fluid transfer device 242. Additionally, an interior fluid control valve is preferably plumbed between the second fluid transfer device 242 and the at least one fluid distribution conduit 244, to control a flow of the second fluid into the interior of the sealed process chamber 168. The preferred embodiment also provides a fluid collection conduit 248 in fluid communication with the interior of the sealed process chamber 168 and the second fluid transfer device 242. The fluid collection conduit 248 returns the second fluid flowing into the interior of the sealed process chamber 168 to the second fluid transfer device 242.

Preferably, a fourth thermal sensor communicating with the returned second fluid and the control system 202 is provided by the second fluid handling system 218. The fourth thermal sensor preferably measures a temperature value of the returned second fluid and provides said measured temperature value to the control system 202. Upon receipt of the measured temperature value by the control system 202, the control system 202 compares the measured temperature value to a predetermined temperature value and sends an interior fluid control valve signal to the interior fluid control valve to modulate flow of the returned second fluid to the second fluid transfer device 242 in response to the interior fluid control valve signal.

Further shown by FIG. 13, the second fluid handling system 218 preferably further includes an in line fluid heater 236, such as a SureHeat MAX® manufactured by OSRAM Sylvania of Danvers Main, USA. Preferably the in line heater 236 is plumbed into the second fluid handling system 218 between the fluid transfer device 242 and the feed conduit 246. The in line fluid heater 236 may be selectively included in the fluid path of the second fluid through activation of a fourth control valve in response to a control signal provided by the control signal buss 222 from the processor 206. The control signal is preferably based on a temperature measurement value provided by a fifth thermal sensor measuring the second fluid exiting the fluid transfer device 242. The in line fluid heater 236 is preferably used when the out flow temperature of the second fluid departing the fluid transfer device 242 is less than a desired inlet temperature of the at least one fluid distribution conduit 244.

Additionally, the second fluid handling system 218 preferably further includes a heat exchanger 250, external to and plumbed into the second fluid handling system 218 between the fluid collection conduit 248 and the second fluid transfer device 242. The heat exchanger 250 may be selectively included in the fluid path of the second fluid through activation of a fifth control valve in response to a control signal provided by the control signal buss 222 from the processor 206 based on a temperature measurement value provided by a sixth thermal sensor measuring the second fluid entering the fluid collection conduit 248.

Preferably, the heat exchanger 250 is utilized to safeguard the fluid transfer device 242 from experiencing a thermal condition that exceeds its operating parameters. Further, to provide data regarding an in use percentage of the fluid transfer device 242, a flow usage monitoring device 252 is preferably used to safeguard against exceeding the operating capabilities of the fluid transfer device 242.

In the preferred embodiment, shown by FIG. 13, the third fluid handling system 220 is preferably a closed loop fluid handling system 220. That is, the third fluid is isolated from all environments external to the closed loop fluid handling system 220. The closed loop fluid handling system 220 preferably includes at least a closed loop fluid transfer device 254 in fluid communication with at least one fluid distribution conduit 256. The at least one fluid distribution conduit 256 is preferably adjacent an interior of the sealed process chamber 168. Preferably, a feed conduit 258 is disposed between the closed loop fluid transfer device 254 and the at least one fluid distribution conduit 256. The feed conduit 258 preferably communicates the isolated third fluid from the closed loop fluid transfer device 254 to the at least one fluid distribution conduit 244.

Also preferably provided by the closed loop fluid handling system 220 is a check valve disposed between the feed conduit 258 and the at least one fluid distribution conduit 256, the check valve mitigating a back flow from the at least one fluid distribution conduit 256 to the closed loop fluid transfer device 254. Additionally, a sixth fluid control valve is preferably plumbed between the closed loop fluid transfer device 254 and the at least one fluid distribution conduit 256, to control a flow of the isolated third fluid into the at least one fluid distribution conduit 256. The preferred embodiment also provides a fluid collection conduit 260 in fluid communication with a return conduit 262 and the closed loop fluid transfer device 254. The fluid collection conduit 260 returns the isolated third fluid flowing into the at least one fluid distribution conduit 256.

Preferably, a seventh thermal sensor that communicates with the returned isolated third fluid and the control system 202 is provided by the second fluid handling system 218. The seventh thermal sensor preferably measures a temperature value of the returned isolated third fluid and provides said measured temperature value to the control system 202. Upon receipt of the measured temperature value by the control system 202, the control system 202 compares the measured temperature value to a predetermined temperature value and sends a fluid control valve signal to the fluid control valve, preferably plumbed in between the fluid collection conduit 260 and the return conduit 262. The fluid control valve preferably functions to modulate flow of the returned isolated third fluid from the return conduit 262 to the closed loop fluid transfer device 254 in response to the fluid control valve signal.

Further shown by FIG. 13, the closed loop fluid handling system 220 preferably further includes an in line fluid heater 264, such as a SureHeat MAX® manufactured by OSRAM Sylvania of Danvers Main, USA. Preferably the in line heater 264 is plumbed into the closed loop fluid handling system 220 between the feed conduit 258 and the at least one fluid distribution conduit 256. The in line fluid heater 236 may be selectively engaged or disengaged during an operation mode of the closed loop fluid handling system 220 in response to a control signal. The control signal is preferably based on a temperature measurement value provided by an eighth thermal sensor measuring the isolated third fluid exiting an external gas to gas heat exchanger 266. The external gas to gas heat exchanger 266 is preferably plumbed into the closed loop fluid handling system 220 between the feed conduit 258 and the closed loop fluid transfer device 254. The in line fluid heater 264 is preferably used when the out flow temperature of the isolated third fluid is departing the external gas to gas heat exchanger 266 is less than a desired inlet temperature of the at least one fluid distribution conduit 256. Preferably, the external gas to gas heat exchanger 266 extracts heat from the isolated third fluid provided by the return conduit 262, and transfers the extracted heat to the isolated third fluid provided by the closed loop fluid transfer device 254.

Additionally, the closed loop fluid handling system 220 preferably further includes a heat exchanger 268, internal to and plumbed within the closed loop fluid transfer device 254. The heat exchanger 268, may be selectively included in the fluid path of the isolated third fluid through activation of a sixth control valve in response to a control signal provided by the control signal buss 222 from the processor 206 based on a temperature measurement value provided by a ninth thermal sensor measuring the isolated third fluid exiting the external gas to gas heat exchanger 266.

Preferably, the heat exchanger 268 is utilized to safeguard a fluid advancement device 270 housed within the closed loop fluid transfer device 254, from experiencing a thermal condition that exceeds the operating parameters of the fluid advancement device 270. Further, to provide data regarding an in use percentage of the closed loop fluid transfer device 254, a flow usage monitoring device 272 is preferably used to safeguard against exceeding the operating capabilities of the fluid advancement device 270, while being operated by a drive system 274, connected to the fluid advancement device 270. In a preferred embodiment the isolated third fluid is held at a pressure below atmospheric pressure, while the fluid is at ambient temperature, to allow for thermal expansion of the isolated third fluid when the isolated third fluid is absorbing thermal energy from the interior of the sealed process chamber 168.

It is noted that each the first fluid, the second fluid, and the isolated third fluid may be any of a number of fluids including, but not limited to, air, water, nitrogen, helium, propylene glycol, ethylene glycol, or any other heat transfer sympathetic fluid.

It is further noted that FIG. 13 shows that the preferred embodiment heat exchange system 200 includes the exemplary combined heat exchange assembly 190, which preferably includes each: the closed loop heat exchanger 174 of FIG. 6; the open loop heat exchanger 178 of FIG. 7; and the thermal sensor assembly 158 of FIG. 8.

A person skilled in the art will understand that alternate embodiments are inherently presented by FIG. 13. A number of these include, but are not limited to, a fluid handling system such as 216 in fluidic communication with the exterior of the sealed process chamber 168, combined with a closed loop heat exchange system in fluidic communication with the interior of the sealed process chamber 168. Wherein the control system 202 communicates with each the fluid handling system 216 and the closed loop heat exchange system, and sets a flow rate of each the fluid flowing around an exterior of the sealed process chamber 168, fluid flowing through the closed loop heat exchange system in response to the measured internal temperature of the sealed process chamber.

In the present alternate embodiment, the closed loop heat exchange system preferably includes at least a fluid transfer device, such as the closed loop fluid transfer device 254 in fluid communication with at least one closed loop heat exchanger, such as the closed loop heat exchanger 174 of FIG. 6. In the present alternate embodiment, the exterior surface of the exemplary closed loop heat exchanger 174 is adjacent an interior surface of the sealed process chamber 168.

A second alternate embodiment includes at least a fluid handling system such as 216 in fluidic communication with the exterior of the sealed process chamber 168, combined with an open loop heat exchange system in fluidic communication with the interior of the sealed process chamber 168. The second alternate embodiment preferably further includes the control system 202, which communicates with each the fluid handling system 216 and the open loop heat exchange system, and sets a flow rate of each the fluid flowing around an exterior of the sealed process chamber 168, fluid flowing through the open loop heat exchange system and into the sealed process chamber 168 processing cavity in response to the measured internal temperature of the sealed process chamber.

In the present second alternate embodiment, the open loop heat exchange system preferably includes at least a fluid transfer device, such as the fluid transfer device 242 in fluid communication with at least one open loop heat exchanger, such as the open loop heat exchanger 178 of FIG. 7. In the present alternate embodiment, the exterior surface of the exemplary closed loop heat exchanger 174 is adjacent an interior surface of the sealed process chamber 168.

A third alternate embodiment includes at least a fluid handling system such as 216 in fluidic communication with the exterior of the sealed process chamber 168, combined with a closed loop heat exchange system, and an open loop heat exchange system, in which both the open loop and closed loop heat exchange systems are in fluidic communication with the interior of the sealed process chamber 168.

The third alternate embodiment preferably further includes the control system 202, which communicates with each the fluid handling system 216, the closed loop heat exchange system, and the open loop heat exchange system, and sets a flow rate of each the fluid flowing around an exterior of the sealed process chamber 168, and the fluid flowing through each the open loop and closed loop heat exchange systems, and into the sealed process chamber 168 processing cavity in response to the measured internal temperature of the sealed process chamber.

In the present third alternate embodiment, the open loop heat exchange system preferably includes at least a fluid transfer device, such as the fluid transfer device 242 in fluid communication with at least one open loop heat exchanger, such as the open loop heat exchanger 178 of FIG. 7. In the present alternate embodiment, the exterior surface of the exemplary closed loop heat exchanger 174 is adjacent an interior surface of the sealed process chamber 168. Further in the third alternate embodiment, the closed loop heat exchange system preferably includes at least a fluid transfer device, such as the closed loop fluid transfer device 254 in fluid communication with at least one closed loop heat exchanger, such as the closed loop heat exchanger 174 of FIG. 6. In the present alternate embodiment, the exterior surface of the exemplary closed loop heat exchanger 174 is adjacent an interior surface of the sealed process chamber 168.

Figure 14:
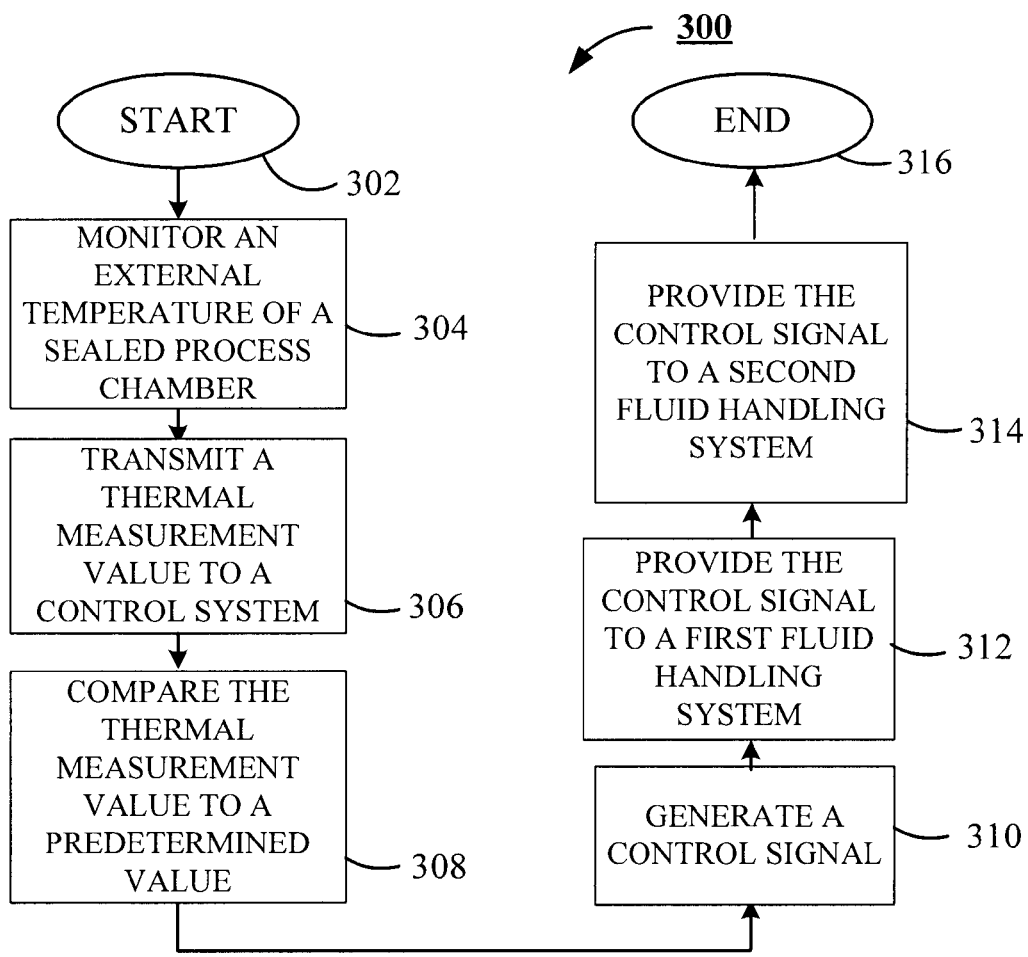
FIG. 14 generally illustrates a flow chart of a method of controlling an exemplary embodiment of the thermal chamber of FIG. 1.

FIG. 14 provides an exemplary method of controlling a thermal chamber 300, which commences at start step 302 and continues with process step 304. At process step 304, an external temperature of a process chamber (such as 168) is monitored. At process step 306, a thermal measurement value is transmitted to a control system (such as 202). At process step 308, the thermal measurement value is compared to a predetermined value. At process step 310, a control signal is generated by the control system based on the comparison of the temperature measurement value and the predetermined value. Preferably, the sealed process chamber includes at least an interior surface and an exterior surface.

A process step 312, the control signal is provided by the control system to a first fluid handling system (such as 216). At process step 314, the control signal is provided by the control system to a second fluid handling system (such as 218 or 220), and the process concludes at end process step 316.

Figure 15:
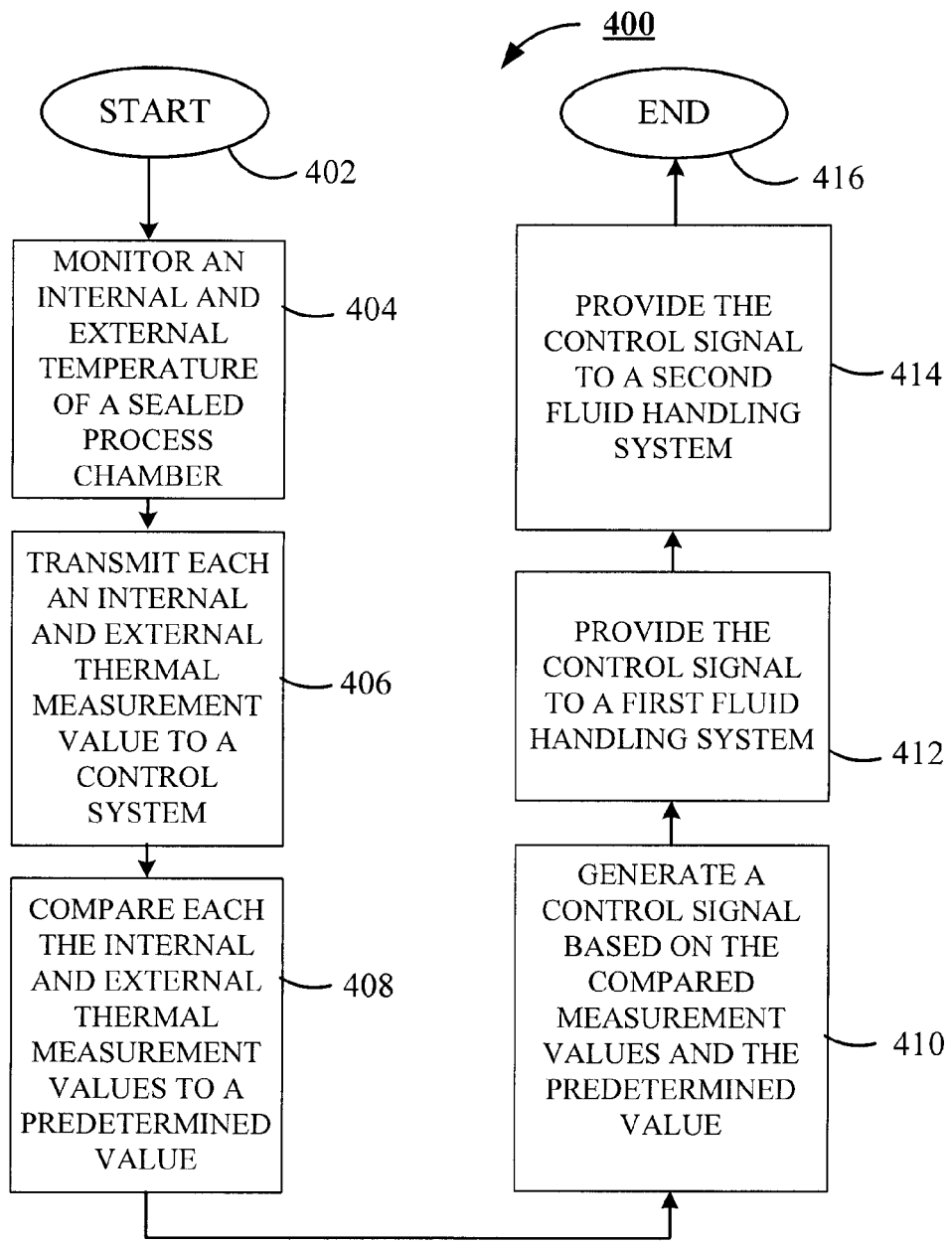
FIG. 15 reveals a flow chart of an alternate method of controlling an exemplary embodiment of the thermal chamber of FIG. 1.

FIG. 15 provides an exemplary method of controlling a thermal chamber 400, which commences at start step 402 and continues with process step 404. At process step 404, an internal and external temperature of a process chamber (such as 168) is monitored. At process step 406, each an internal and external thermal measurement value is transmitted to a control system (such as 202). At process step 408, each of the internal and external thermal measurement values are compared to a predetermined value. At process step 410, a control signal is generated by the control system based on the compared internal and external measurement values, and the pre-determined value. Preferably, the sealed process chamber includes at least an interior surface and an exterior surface.

A process step 412, the control signal is provided by the control system to a first fluid handling system (such as 216). Preferably, the first fluid handling system provides a fluid inlet box (such as 112), which in turn provides a plate valve (such as 134). The plate valve mitigates the flow of fluid from the thermal regulation cavity through the fluid inlet box and external the containment chamber, and wherein the fluid inlet box further includes a flow adjustment structure (such as 136) interacting with the plate valve to control fluid flow from external the containment chamber, past the plate valve and into the thermal regulation cavity.

A process step 414, the control signal is provided by the control system to a second fluid handling system (such as 218 or 220), and the process concludes at end process step 416. Preferably, the second fluid handling system provides means for transferring fluid into and out of the interior of the sealed process chamber during a thermal diffusion process cycle.

Figure 16:
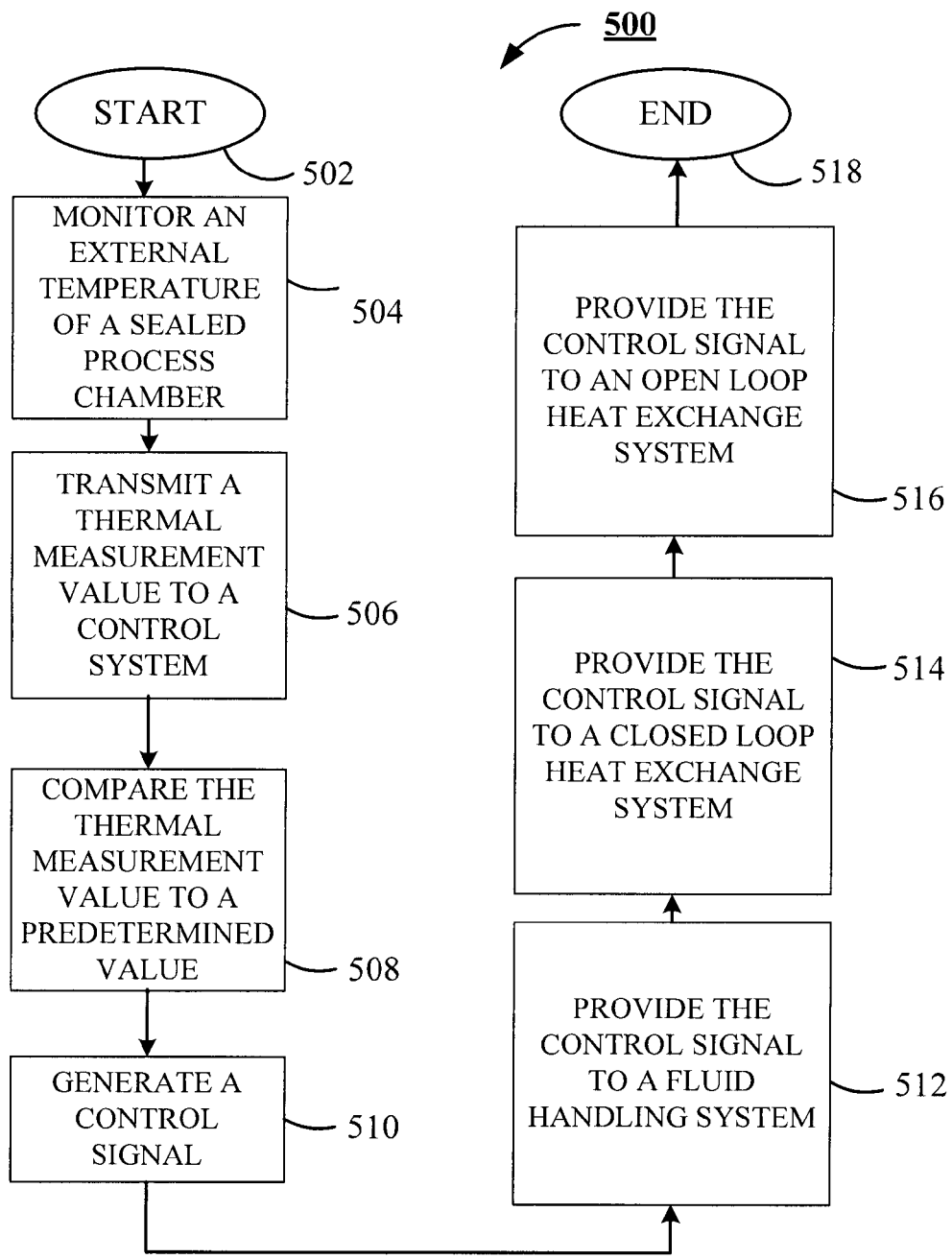
FIG. 16 shows a flow chart of an alternative method of controlling an alternate exemplary embodiment of the thermal chamber of FIG. 1.

FIG. 16 provides an exemplary method of controlling a thermal chamber 500, which commences at start step 502 and continues with process step 504. At process step 504, an external temperature of a process chamber (such as 168) is monitored. At process step 506, a thermal measurement value is transmitted to a control system (such as 202). At process step 508, the thermal measurement value is compared to a predetermined value. At process step 510, a control signal is generated by the control system based on the comparison of the temperature measurement value and the predetermined value. Preferably, the sealed process chamber includes at least an interior surface and an exterior surface.

A process step 512, the control signal is provided by the control system to a fluid handling system (such as 216). Preferably, the first fluid handling system provides a fluid inlet box (such as 112), which in turn provides a plate valve (such as 134). The plate valve mitigates the flow of fluid from the thermal regulation cavity through the fluid inlet box and external the containment chamber, and wherein the fluid inlet box further includes a flow adjustment structure (such as 136) interacting with the plate valve to control fluid flow from external the containment chamber, past the plate valve and into the thermal regulation cavity.

A process step 514, the control signal is provided by the control system to a closed loop heat exchange system (such as 296 of FIG. 13). Preferably, the closed loop heat exchange system provides means for transferring fluid into and out of the interior of the sealed process chamber during a thermal diffusion process cycle, without exposing the transferred fluid to the internal environment of the sealed process chamber. At process step 516, the control signal is provided by the control system to an open loop heat exchange system (such as 298 of FIG. 13); the open loop heat exchange system is preferably positioned in fluidic communication with an interior of the sealed process chamber. Preferably, the open loop heat exchange system provides means for transferring fluid into and out of the interior of the sealed process chamber during a thermal diffusion process cycle, by pulling the transferred fluid through the internal environment of the sealed process chamber, and the process concludes at end process step 518.

Figure 17:
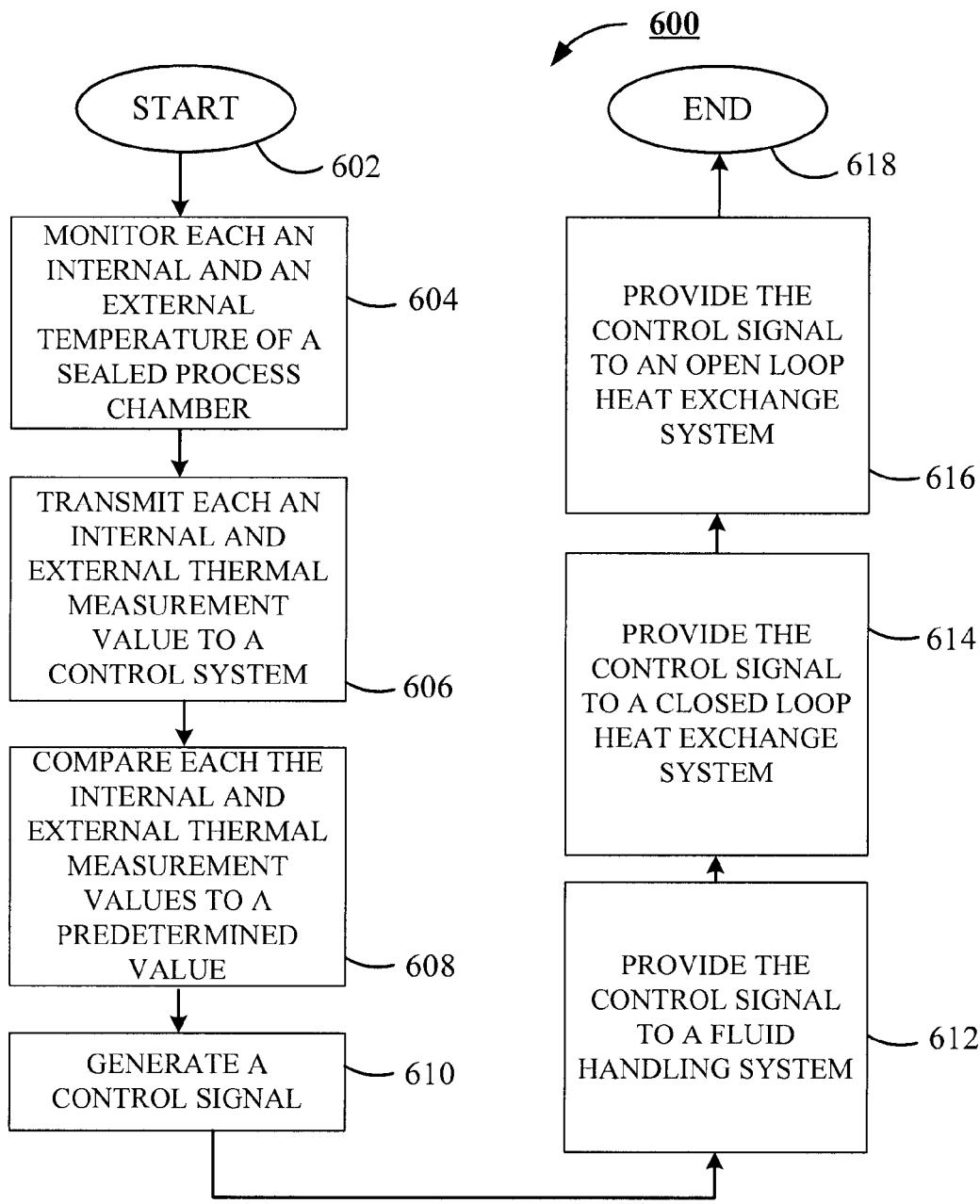
FIG. 17 displays a flow chart of an alternative alternate method of controlling an exemplary embodiment of the thermal chamber of FIG. 1.

FIG. 17 provides an exemplary method of controlling a thermal chamber 600, which commences at start step 602 and continues with process step 604. At process step 604, an internal and external temperature of a process chamber (such as 168) is monitored. At process step 606, each an internal and external thermal measurement value is transmitted to a control system (such as 202). At process step 608, each of the internal and external thermal measurement values are compared to a predetermined value. At process step 610, a control signal is generated by the control system based on the compared internal and external measurement values, and the predetermined value. Preferably, the sealed process chamber includes at least an interior surface and an exterior surface.

A process step 612, the control signal is provided by the control system to a fluid handling system (such as 216). Preferably, the first fluid handling system provides a fluid inlet box (such as 112), which in turn provides a plate valve (such as 134). The plate valve mitigates the flow of fluid from the thermal regulation cavity through the fluid inlet box and external the containment chamber, and wherein the fluid inlet box further includes a flow adjustment structure (such as 136) interacting with the plate valve to control fluid flow from external the containment chamber, past the plate valve and into thermal regulation cavity.

A process step 614, the control signal is provided by the control system to a closed loop heat exchange system (such as 296 of FIG. 13). Preferably, the closed loop heat exchange system provides means for transferring fluid into and out of the interior of the sealed process chamber during a thermal diffusion process cycle, without exposing the transferred fluid to the internal environment of the sealed process chamber. At process step 616, the control signal is provided by the control system to an open loop heat exchange system (such as 298 of FIG. 13); the open loop heat exchange system is preferably positioned in fluidic communication with an interior of the sealed process chamber. Preferably, the open loop heat exchange system provides means for transferring fluid into and out of the interior of the sealed process chamber during a thermal diffusion process cycle, by pulling the transferred fluid through the internal environment of the sealed process chamber, and the process concludes at end process step 618.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present claimed invention to the full extent indicated by the broad general meaning of the terms in which the appended claims are expressed. For example, the particular elements may vary depending on the particular application without departing from the spirit and scope of the present claimed invention.

It will be clear that the present invention is well adapted to attain the ends and advantages mentioned as well as those inherent therein. While presently preferred embodiments have been described for purposes of this disclosure, numerous changes may be made which will readily suggest themselves to those skilled in the art and which are encompassed by the appended claims.

What is claimed is:

1. A method of controlling a thermal diffusion chamber by steps comprising:
   monitoring an exterior temperature of a sealed process chamber;
   transmitting an exterior thermal measurement value to a control system based on the monitored external temperature of the sealed process chamber;
   comparing the external thermal measurement value to a predetermined value;
   generating a control signal based on the comparison of the external thermal measurement value to the predetermined value;
   providing the control signal to a fluid handling system, wherein the fluid handling system modulates flow of a first fluid around the exterior of the sealed process chamber based on the control signal;
   providing the control signal to a closed loop heat exchange system, wherein the closed loop heat exchange system modulates flow of a second fluid within an interior cavity of the sealed process chamber based on the control signal; and
   providing the control signal to an open loop heat exchange system, wherein the open loop heat exchange system modulates flow of a third fluid within the interior of cavity of the sealed process chamber.

2. The method of claim 1, in which the exterior temperature of a sealed process chamber is monitored by steps comprising;
   securing a plurality of thermocouples in contacting adjacency with the sealed process chamber;
   attaching a electrical lead lines associated with each corresponding thermocouple of the plurality of thermocouples to a control signal buss;
   connecting the control signal buss to the control system; and
   activating each of the thermocouples of the plurality of thermocouples to indicate monitoring, of the exterior temperature of the sealed process chamber.

3. The method of claim 1, in which the control system includes at least;
   the control signal buss communicating with at least the fluid handling system, the closed loop heat exchange system, and the open loop heat exchange system; and
   a controller communicating with the control signal buss, the controller comprising:
   an input/output module communicating with the control signal buss;
   a processor communicating with the input/output module;
   a memory storing control logic and communicating with the processor;
   an input device communicating with the processor; and
   a display communicating: with the processor, wherein upon receipt by the input/output module of the measured external thermal measurement value, the input/output module provides the measured external thermal measurement value to the processor, the processor accesses the stored control logic and determines the control signal based on the measured external thermal measurement value, the processor provides the control signal to the input/output module, the input/output module advances the control signal by way of the control signal buss to each the fluid handling systems, the closed loop heat exchange system, and the open loop heat exchange system.

4. The method of claim 1, in which the fluid handling system comprising:
   a first fluid transfer device in fluid communication with at least one fluid inlet box, the at least one fluid inlet box in fluidic communication with an exterior of the sealed process chamber and including at least a flow adjustment structure to control a flow of the first fluid around the exterior of the sealed process chamber;
   a fluid return conduit in fluid communication with the exterior of the sealed process chamber and the fluid transfer device, the fluid return conduit returning the first fluid flowing around the sealed process chamber to the fluid transfer device;

a thermal sensor communicating with the returned first fluid and the control system, the thermal sensor measures a temperature value of the returned first fluid, the thermal sensor further provides said measured temperature value of the returned first fluid to the control system; and a control valve plumbed in between the fluid return conduit and the first fluid transfer device, wherein upon receipt by the control system of the measured temperature value of the returned first fluid, the control system compares the measured temperature value of the returned first fluid to a predetermined temperature value and sends a control signal to the control valve, and wherein the control valve modulates flow of the returned first fluid from the exterior of the sealed process chamber to the first fluid transfer device in response to the control signal.

5. The method of claim 1, in which the closed loop heat exchange system comprising:

a second fluid transfer device;

an at least one closed loop heat exchanger in fluid communication with the second fluid transfer device, wherein an exterior surface of the at least one closed loop heat exchanger is adjacent an interior surface of the sealed process chamber;

a feed conduit disposed between the at least one closed loop heat exchanger and the second fluid transfer device, the feed conduit provides the second fluid to an interior of the at least one closed loop heat exchanger; and a check valve plumbed in between the feed conduit and the at least one closed loop heat exchanger, the check valve mitigating a back flow of the second fluid from the interior of the at least one closed loop heat exchanger to the second fluid transfer device.

6. The method of claim 1, in which the open loop heat exchange system comprising:

a third fluid transfer device;

an at least one open loop heat exchanger in fluid communication with the third fluid transfer device, wherein an exterior surface of the at least one open loop heat exchanger is adjacent an interior surface of the sealed process chamber;

a feed conduit disposed between the at least one open loop heat exchanger and the third fluid transfer device, the feed conduit provides the third fluid to an interior of the at least one open loop heat exchanger;

a check valve disposed between the feed conduit and the at least one open loop heat exchanger, the check valve mitigating a back flow of the third fluid from the interior of the at least one open loop heat exchanger to the third fluid transfer device; and an interior control valve disposed between the third fluid transfer device and the at least one open loop heat exchanger, the interior control valve controls a flow of the third fluid into an interior volume of the at least one open loop heat exchanger, wherein the at least open loop heat exchanger includes at least one fluid distribution conduit, the fluid distribution conduit provides openings to release the third fluid from the at least one open loop heat exchanger into an interior volume of the sealed process chamber.

7. A method of controlling a thermal diffusion chamber by steps comprising:

monitoring each an internal and external temperature of a sealed process chamber;

transmitting each an internal thermal measurement value and an external thermal measurement value to a control system based on the corresponding monitored internal and external temperature of the sealed process chamber;

comparing each the internal and external thermal measurement values to a predetermined value;

generating a control signal based on the comparison of each the internal and external thermal measurement value to the predetermined value;

providing the control signal to a fluid handling system, wherein the fluid handling system modulates flow of a first fluid around the exterior of the sealed process chamber based on the control signal;

providing the control signal to a closed loop heat exchange system, wherein the closed loop heat exchange system modulates flow of a second fluid within an interior cavity of the sealed process chamber based on the control signal; and providing the control signal to an open loop heat exchange system, wherein the open loop heat exchange system modulates flow of a third fluid within the interior of cavity of the sealed process chamber.

8. The method of claim 7, in which each the internal and external temperature of a sealed process chamber is monitored by steps comprising;

disposing a plurality of internal thermocouples internal to a sensor conduit;

positioning the sensor conduit enclosed internal thermocouples within the sealed process chamber;

attaching a electrical lead lines associated with each corresponding internal thermocouple of the plurality of internal thermocouples to a control signal buss;

connecting the control signal buss to the control system;

activating each of the internal thermocouples of the plurality of internal thermocouples to indicate monitoring of the interior temperature of the sealed process chamber;

securing a plurality of external thermocouples in contacting adjacency with the sealed process chamber;

attaching a electrical lead lines associated with each corresponding external thermocouple of the plurality of external thermocouples to a control signal buss;

connecting the control signal buss to the control system; and activating each of the external thermocouples of the plurality of thermocouples to indicate monitoring of the exterior temperature of the sealed process chamber.

9. The method of claim 7, in which the control system includes at least;

the control signal buss communicating with at least each the fluid handling systems, the closed loop heat exchange system, and the open loop heat exchange system; and a controller communicating with the control signal buss, the controller comprising:

an input/output module communicating with the control signal buss;

a processor communicating with the input/output module;

a memory storing control logic and communicating with the processor;

an input device communicating with the processor; and a display communicating with the processor, wherein upon receipt by the input/output module of each the measured internal and external thermal measurement values, the input/output module provides each the measured internal and external thermal measurement values to the processor, the processor accesses the stored control logic and determines the control signal based collectively on both the measured internal and external thermal measurement values, the processor provides the control signal to the input/output module, the input/output module advances the control signal by way of the control signal buss to each the fluid handling, systems, the closed loop heat exchange system, and the open loop heat exchange system.

10. The method of claim 7, in which the fluid handling system comprising:
a first fluid transfer device in fluid communication with at least one fluid inlet box, the at least one fluid inlet box in fluidic communication with an exterior of the sealed process chamber and including at least a flow adjustment structure to control a flow of the first fluid around the exterior of the sealed process chamber;
a fluid return conduit in fluid communication with the exterior of the sealed process chamber and the fluid transfer device, the fluid return conduit returning the first fluid flowing around the sealed process chamber to the fluid transfer device;
a thermal sensor communicating with the returned first fluid and the control system, the thermal sensor measures a temperature value of the returned first fluid, the thermal sensor further provides said measured temperature value of the returned first fluid to the control system; and
a control valve plumbed in between the fluid return conduit and the first fluid transfer device, wherein upon receipt by the control system of the measured temperature value of the returned first fluid, the control system compares the measured temperature value of the returned first fluid to a predetermined temperature value and sends a control signal to the control valve, and wherein the control valve modulates flow of the returned first fluid from the exterior of the sealed process chamber to the first fluid transfer device in response to the control signal.

11. The method of claim 7, in which the closed loop heat exchange system comprising:
a second fluid transfer device;
an at least one closed loop heat exchanger in fluid communication with the second fluid transfer device, wherein an exterior surface of the at least one closed loop heat exchanger is adjacent an interior surface of the sealed process chamber;
a feed conduit disposed between the at least one closed loop heat exchanger and the second fluid transfer device, the feed conduit provides the second fluid to an interior of the at least one closed loop heat exchanger; and
a check valve plumbed in between the feed conduit and the at least one closed loop heat exchanger, the check valve mitigating a back flow of the second fluid from the interior of the at least one closed loop heat exchanger to the second fluid transfer device.

12. The method of claim 7, in which the open loop heat exchange system comprising:
a third fluid transfer device;
an at least one open loop heat exchanger in fluid communication with the third fluid transfer device, wherein an exterior surface of the at least one open loop heat exchanger is adjacent an interior surface of the sealed process chamber;
a feed conduit disposed between the at least one open loop heat exchanger and the third fluid transfer device, the feed conduit provides the third fluid to an interior of the at least one open loop heat exchanger;
a check valve plumbed in between the feed conduit and the at least one open loop heat exchanger, the check valve mitigating a back flow of the third fluid from the interior of the at least one open loop heat exchanger to the third fluid transfer device; and
an interior control valve plumbed in between the third fluid transfer device and the at least one open loop heat exchanger, the interior control valve controls a flow of the third fluid into an interior volume of the at least one open loop heat exchanger, wherein the at least open loop heat exchanger includes at least one fluid distribution conduit, the fluid distribution conduit provides openings to release the third fluid from the at least one open loop heat exchanger into an interior volume of the sealed process chamber.

\* \* \* \* \*